US 11,292,245 B2

(12) United States Patent
Bishop et al.

(10) Patent No.: US 11,292,245 B2
(45) Date of Patent: Apr. 5, 2022

(54) MICROELECTROMECHANICAL SHUTTERS FOR ORGANIC VAPOR JET PRINTING

(71) Applicants: Trustees of Boston University, Boston, MA (US); The Regents of the University of Michigan, Ann Arbor, MI (US)

(72) Inventors: David J. Bishop, Boston, MA (US); Lawrence Barrett, Boston, MA (US); Stephen Forrest, Ann Arbor, MI (US)

(73) Assignees: Trustees of Boston University, Boston, MA (US); The Regents of the University of Michigan, Ann Arbor, MI (US)

( * ) Notice: Subject to any disclaimer, the term of this patent is extended or adjusted under 35 U.S.C. 154(b) by 0 days.

(21) Appl. No.: 16/891,864

(22) Filed: Jun. 3, 2020

(65) Prior Publication Data
US 2021/0206162 A1 Jul. 8, 2021

Related U.S. Application Data

(60) Provisional application No. 62/956,945, filed on Jan. 3, 2020.

(51) Int. Cl.
*B41J 2/045* (2006.01)
*C23C 14/12* (2006.01)
(Continued)

(52) U.S. Cl.
CPC ............ *B41J 2/04501* (2013.01); *B41J 2/04* (2013.01); *B81B 7/008* (2013.01); *C23C 14/12* (2013.01); *C23C 14/54* (2013.01); *B41J 2202/05* (2013.01)

(58) Field of Classification Search
CPC ...... B41J 2/04501; B41J 2202/05; B41J 2/04; B81B 7/008; C23C 14/12; C23C 14/54
See application file for complete search history.

(56) References Cited

U.S. PATENT DOCUMENTS 4,769,292 A   9/1988 Tang
5,247,190 A   9/1993 Friend
(Continued)

FOREIGN PATENT DOCUMENTS

EP   1238981        9/2002
JP   2010-135467    6/2010
(Continued)

OTHER PUBLICATIONS

International Search Report and Written Opinion of International Searching Authority for Application No. PCT/US2020/035931, dated Aug. 18, 2020 (12 pages).
(Continued)

*Primary Examiner* — Jeffrie R Lund
(74) *Attorney, Agent, or Firm* — Nixon Peabody LLP

(57) ABSTRACT

A device includes a nozzle including a discharge end for discharging a fluid, a shutter plate including an aperture, the shutter plate positioned at the discharge end of the nozzle, a plurality of tethers coupled to the shutter plate, and a plurality of electrostatic actuators. Each of the plurality of electrostatic actuators are coupled to one or more of the plurality of tethers. The plurality of electrostatic actuators are configured to move the shutter plate between an open position and a closed position relative the discharge end of the nozzle. In the open position, the aperture is in fluid communication with the discharge end of the nozzle to permit fluid from the discharge end of the nozzle to flow through the aperture. In the closed position, at least a portion
(Continued)

of the shutter plate inhibits fluid from the discharge end of the nozzle from flowing through the aperture.

27 Claims, 12 Drawing Sheets

(51) Int. Cl.
*C23C 14/54* (2006.01)
*B81B 7/00* (2006.01)
*B41J 2/04* (2006.01)

(56) References Cited

U.S. PATENT DOCUMENTS

| | | |
|---|---|---|
| 5,703,436 A | 12/1997 | Forrest |
| 5,707,745 A | 1/1998 | Forrest |
| 5,834,893 A | 11/1998 | Bulovic |
| 5,844,363 A | 12/1998 | Gu |
| 6,013,982 A | 1/2000 | Thompson |
| 6,087,196 A | 7/2000 | Sturm |
| 6,091,195 A | 7/2000 | Forrest |
| 6,097,147 A | 8/2000 | Baldo |
| 6,294,398 B1 | 9/2001 | Kim |
| 6,303,238 B1 | 10/2001 | Thompson |
| 6,337,102 B1 | 1/2002 | Forrest |
| 6,468,819 B1 | 10/2002 | Kim |
| 7,279,704 B2 | 10/2007 | Walters |
| 7,360,871 B2 * | 4/2008 | Silverbrook ............ G06F 21/79 347/54 |
| 7,401,884 B2 * | 7/2008 | Silverbrook ............ B41J 2/1642 347/20 |
| 7,410,250 B2 * | 8/2008 | Silverbrook ............ G06K 1/121 347/94 |
| 7,431,968 B1 | 10/2008 | Shtein |
| 7,527,357 B2 * | 5/2009 | Silverbrook ............ B41J 2/1639 347/54 |
| 7,669,970 B2 * | 3/2010 | Silverbrook ............ B41J 2/1643 347/54 |
| 7,968,146 B2 | 6/2011 | Wagner |
| 2003/0230980 A1 | 12/2003 | Forrest |
| 2004/0174116 A1 | 9/2004 | Lu |
| 2005/0030339 A1 | 2/2005 | Silverbrook |
| 2008/0158301 A1 * | 7/2008 | Silverbrook ............ B41J 2/1645 347/54 |
| 2009/0079783 A1 * | 3/2009 | Mehta .................... B41J 2/04 347/21 |
| 2009/0214782 A1 | 8/2009 | Forrest |
| 2010/0201749 A1 | 8/2010 | Somekh |
| 2010/0245479 A1 | 9/2010 | Forrest |
| 2013/0026452 A1 | 1/2013 | Kottas |
| 2013/0063529 A1 | 3/2013 | Hong |
| 2013/0119354 A1 | 5/2013 | Ma |
| 2013/0208036 A1 | 8/2013 | Forrest |
| 2015/0380648 A1 | 12/2015 | McGraw |
| 2017/0159847 A1 * | 6/2017 | Alexeenko ............ B64G 1/10 |
| 2017/0229663 A1 | 8/2017 | Tsai |
| 2019/0221783 A1 | 7/2019 | McGraw |
| 2019/0232325 A1 | 8/2019 | McGraw |
| 2019/0256968 A1 | 8/2019 | Quinn |
| 2019/0386257 A1 | 12/2019 | Quinn |
| 2020/0303645 A1 * | 9/2020 | Forrest .................... B81B 7/008 |
| 2021/0206162 A1 * | 7/2021 | Bishop .................... C23C 14/12 |
| 2021/0343941 A1 * | 11/2021 | Forrest .................. C23C 14/228 |

FOREIGN PATENT DOCUMENTS

| | | |
|---|---|---|
| WO | WO 2004/111066 | 12/2004 |
| WO | WO 2008/044723 | 4/2008 |
| WO | WO 2008/057394 | 5/2008 |
| WO | WO 2010/011390 | 1/2010 |
| WO | WO 2010/111175 | 9/2010 |

OTHER PUBLICATIONS

Baldo et al., "Highly Efficient Phosphorescent Emission from Organic Electroluminescent Devices," Nature, vol. 395, 151-154 (1998).

Baldo et al., "Very high-efficiency green organic light-emitting devices based on electrophosphorescence," Appl. Phys. Lett., 75(3):4-6 (1999).

* cited by examiner

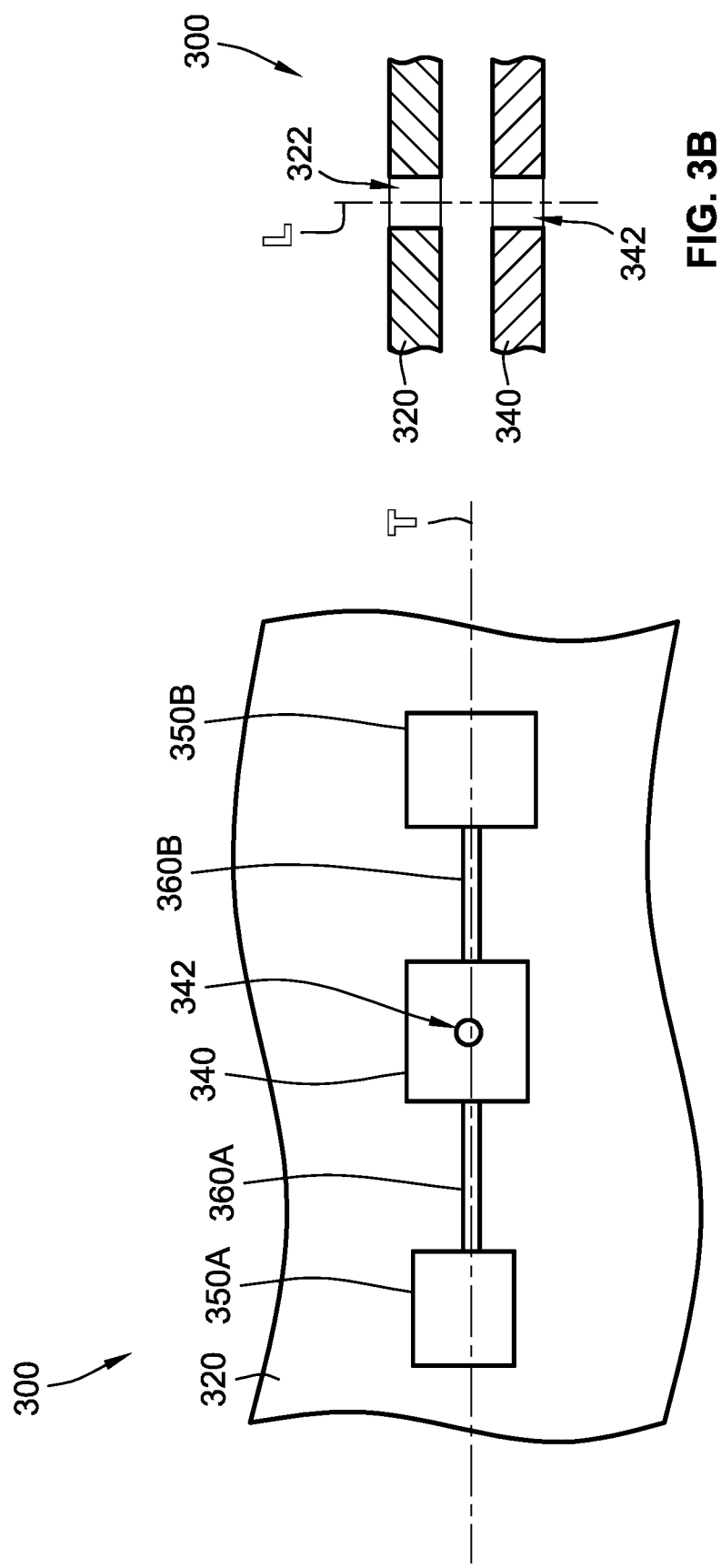

MICROELECTROMECHANICAL SHUTTERS FOR ORGANIC VAPOR JET PRINTING

CROSS REFERENCE TO RELATED APPLICATIONS

This application claims the benefit of, and priority to, U.S. Provisional Application No. 62/956,945, filed Jan. 3, 2020, which is hereby incorporated by reference herein in its entirety.

STATEMENT REGARDING FEDERALLY SPONSORED RESEARCH

This invention was made with government support under Grant No. EEC-1647837 awarded by the National Science Foundation (NSF) and Grant No. FA8650-15-C-7545 awarded by the Defense Advanced Research Projects Agency (DARPA) and Air Force Research Laboratory (AFRL). The government has certain rights in the invention.

TECHNICAL FIELD

The present disclosure relates generally to microelectromechanical (MEMS) shutters, and more particularly, to MEMS shutters for organic vapor jet printing (OVJP).

BACKGROUND

Organic vapor jet printing (OVJP) is a technique used to deposit and pattern organic molecules at high speeds to form micron-scale features. The OVJP technique vaporizes the organic material to be deposited on a substrate and carries the vaporized molecules to the substrate using an inert carrier gas. OVJP is used, for example, in the manufacture of organic light emitted diode (OLED) displays. However, one limitation of OVJP systems is that the flow of vaporized organic molecules must be continuous. In fact, vaporized organic molecules often continue to flow for hours or even days after the OVJP system is turned off. The present disclosure is directed to solving these and other problems.

SUMMARY

According to some implementations of the present disclosure, a microelectromechanical device includes a nozzle, a shutter plate, a plurality of tethers, and a plurality of electrostatic actuators. The nozzle includes a discharge end for discharging a fluid. The shutter plate is positioned at the discharge end of the nozzle. Each of the plurality of tethers is coupled to the shutter plate. Each of the plurality of electrostatic actuators are coupled to one or more of the plurality of tethers and are configured to move the shutter plate between an open position and a closed position relative the discharge end of the nozzle, such that (i) in the open position, the aperture is in fluid communication with the discharge end of the nozzle to permit fluid from the discharge end of the nozzle to flow through the aperture and (ii) in the closed position, at least a portion of the shutter plate inhibits fluid from the discharge end of the nozzle from flowing through the aperture.

According to some implementations of the present disclosure, a microelectromechanical device comprises a shutter plate, a plurality of tethers, and a plurality of actuators. The shutter plate includes one or more apertures and is configured to move in response to an input between a first position and a second position relative to an organic vapor jet printing (OVJP) nozzle along a longitudinal axis of the aperture. The shutter plate is positioned relative to the OVJP nozzle such that (i) in the first position along the longitudinal axis, the shutter plate is spaced from the OVJP nozzle and (ii) in the second position along the longitudinal axis, at least a portion of the shutter plate directly abuts at least a portion of the OVJP nozzle. Each of the plurality of tethers is coupled to the shutter plate. Each of the plurality of electrostatic actuators are coupled to one or more of the plurality of tethers and are configured to move the shutter plate between a third position and a fourth position along a transverse axis relative to the OVJP nozzle when the shutter plate is in the first position along the longitudinal axis such that (i) in the third position along the transverse axis and the first position along the longitudinal axis, one of the one or more apertures is in fluid communication with the OVJP nozzle to permit organic molecules from the OVJP nozzle to flow through the aperture and (ii) in the fourth position along the transverse axis and the second portion along the longitudinal axis, the direct abutment between the shutter plate and the OVJP nozzle inhibits organic molecules from the OVJP nozzle from flowing through the one or more apertures.

According to some implementations of the present disclosure, a system includes an organic vapor jet printing (OVJP) print head, a nozzle, and a shutter assembly. The organic vapor jet printing (OVJP) print head provides a fluid. The nozzle is coupled to the OVJP print head and the shutter assembly is coupled to the nozzle. The shutter assembly includes a shutter plate having an aperture. The shutter plate moves relative to the nozzle (i) between a first position and a second position along a longitudinal axis in response to a first input and (ii) with the shutter plate in the first position along the longitudinal axis, between a third position and a fourth position along a transverse axis in response to a second input. The shutter plate is positioned relative to the nozzle such that: in response to the shutter plate being in the first position along the longitudinal axis and the third position along the transverse axis, the aperture is in fluid communication with the nozzle to aid in directing at least a portion of the fluid from the OVJP print head toward a substrate, and in response to the shutter plate being in the second position along the longitudinal axis and the fourth position along the transverse axis, at least a portion of the shutter plate inhibits the fluid from the OVJP print head from being directed towards the substrate.

According to some implementations of the present disclosure, a method comprises moving, using a plurality of electrostatic actuators, a shutter plate along a transverse axis in a first direction relative to a nozzle such that an aperture of the shutter plate is generally aligned with the nozzle. The method also includes directing, using an organic vapor jet printing (OVJP) print head, a fluid through the nozzle and the aperture of the shutter plate such that the fluid is deposited on a substrate at a first location for a first predetermined duration, subsequent to the first predetermined duration. The method further includes moving, using the plurality of electrostatic actuators, the shutter plate along the transverse axis in a second opposing direction relative to the nozzle. The method additionally includes moving the shutter plate in along a longitudinal axis relative to the nozzle such that at least a portion of the shutter plate directly abuts the nozzle, thereby inhibiting the fluid from being deposited onto the substrate.

According to some implementations of the present disclosure, a microelectromechanical device includes a nozzle and a shutter plate. The nozzle includes a discharge end for discharging vaporized organic molecules. The shutter plate includes an aperture and is positioned at the discharge end of the nozzle. The shutter plate is configured to move relative to the nozzle between an open position and a closed position in response to an input such that (i) in the open position, the aperture is in fluid communication with the discharge end of the nozzle and (ii) in the closed position, at least a portion of the shutter plate inhibits fluid communication between the discharge end of the nozzle and the aperture.

The above summary is not intended to represent each embodiment or every aspect of the present invention. Additional features and benefits of the present invention are apparent from the detailed description and figures set forth below.

BRIEF DESCRIPTION OF THE DRAWINGS

FIG. 3A is a plan view of a microelectromechanical (MEMS) system with a shutter plate in an open position along a transverse axis, according to some implementations of the present disclosure;

FIG. 3B is a partial side view of the MEMS system of FIG. 3A with the shutter plate in a spaced positioned along a longitudinal axis, according to some implementations of the present disclosure;

Figure 1:
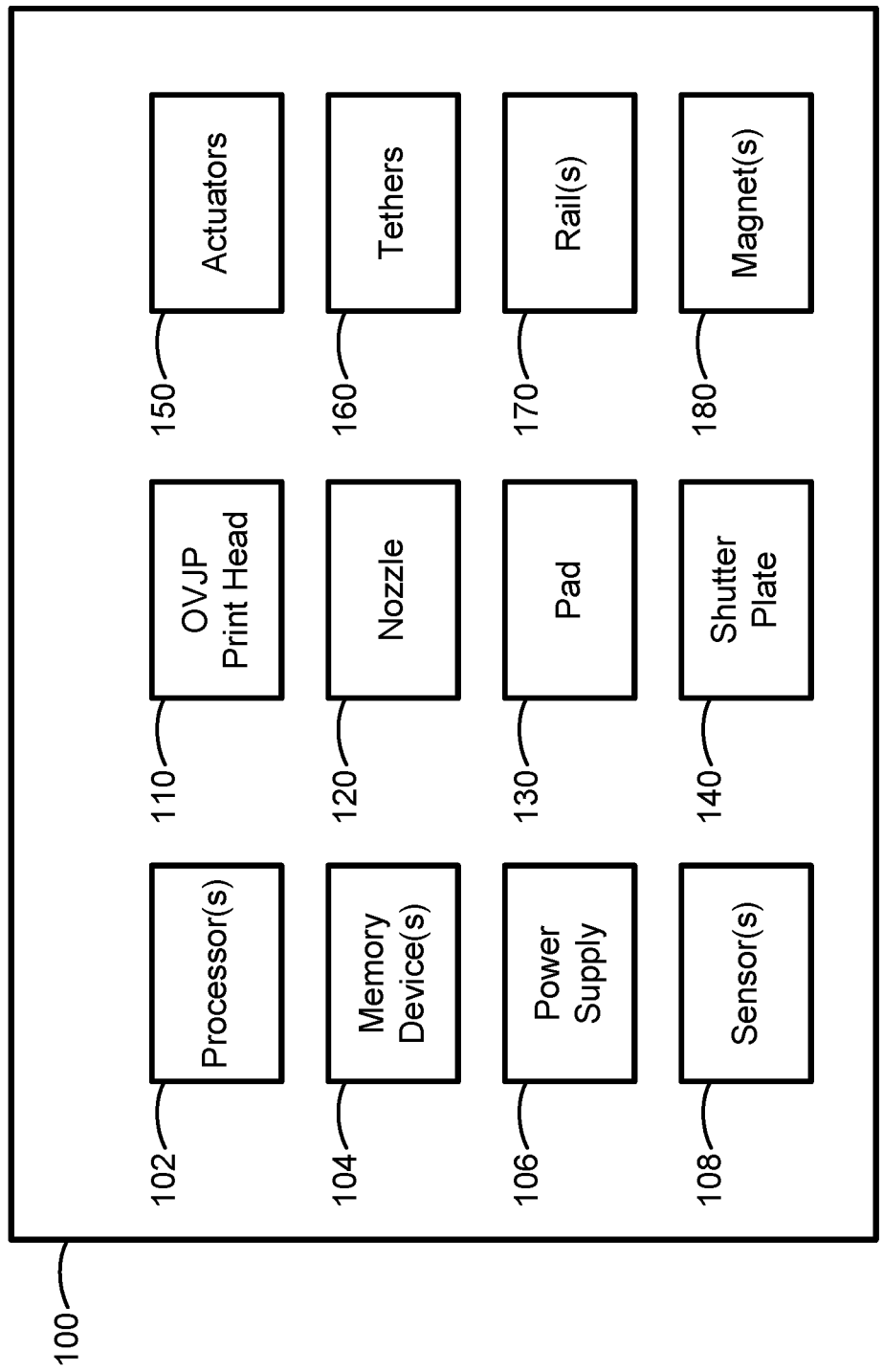
FIG. 1 is a schematic diagram of a system for organic vapor jet printing, according to some implementations of the present disclosure.

While the disclosure is susceptible to various modifications and alternative forms, specific embodiments thereof have been shown by way of example in the drawings and will herein be described in detail. It should be understood, however, that it is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Organic vapor jet printing (OVJP) processes or techniques are often used to deposit and pattern organic molecules at high speeds on a substrate by vaporizing organic molecules and delivering them to the substrate using an inert carrier gas, combining lithography and deposition steps into a single process. OVJP techniques are often used, for example, in the manufacture of organic light emitting diode (OLED) displays to rapidly print micron-scale organic features. In one example, the OVJP technique can be used to pattern a 50-inch OLED display in less than one minute. More generally, OVJP techniques can be used in the manufacture of displays, lighting (e.g., OLED lighting), solar energy (e.g., solar cells or panels), and other related technologies.

This disclosure contemplates, among other things, the use of OVJP techniques in biological tissue engineering. For example, OVJP techniques can be used to deposit organic molecules on a substrate to act as focal attachment points for cardiomyocytes in nano-mechanical scaffolds. Cardiomyocytes have structures called desmosomes on each end that act as mechanical attachment points between sarcomeres in neighboring cells, such that the forces generated in one cell are linked to the forces generated in all of the cells in the tissue. In other words, these attachment points cause the contracting cells to combine to form contracting tissues. Desirably, the patterns and structures of the focal attachment points mimic the natural cell environment to generate optimal contraction forces. Thus, it would be advantageous to use OVJP techniques to pattern organic material onto these focal attachment points to create mechanical structures (e.g., to mimic natural cells and generate optimal contraction forces in the cardiomyocytes). Other applications of the disclosed OVJP techniques are contemplated, as well.

However, one limitation of conventional OVJP systems is that the flow of vaporized organic molecules is continuous such that the patterning (often referred to as writing) onto the substrate must be continuous. Vaporized organic molecules can continue to flow from the nozzle for hours or even days after the OVJP system is turned off. A desirable aspect of the present disclosure is that the disclosed systems and methods overcome limitations of conventional OVJP system that can only deposit or write a continuous line of organic material and cannot selectively write organic material onto only discontinuous locations or points on the substrate.

Referring to FIG. 1, a microelectromechanical (MEMS) system 100 includes one or more processors 102 (hereinafter, processor 102), one or more memory devices 104 (hereinafter, memory device 104), a power supply 106, an organic vapor jet printing (OVJP) print head 110, a nozzle 120, and a shutter plate 140. As described herein, the system 100 can be used to selectively deposit organic molecules from the OVJP print head onto a substrate by moving the shutter plate 140 relative to the nozzle 120. The system 100 thus overcomes the drawbacks and limitations of conventional OVJP processes, facilitating the selective deposition or writing of micron-scale organic features on a substrate (e.g., to create organic focal attachment points for cardiomyocytes in nano-mechanical scaffolds).

The processor 102 is generally used to control (e.g., actuate) the various components of the system 100 and/or analyze data obtained and/or generated by the components of the system 100. The processor 102 can be a general or special purpose processor or microprocessor. While one processor 102 is shown in FIG. 1, the system 100 can include any suitable number of processors (e.g., one processor, two processors, five processors, ten processors, etc.).

The memory device 104 stores machine-readable instructions that are executable by the processor 102. The memory device 104 can be any suitable computer readable storage device or media, such as, for example, a random or serial access memory device, a hard drive, a solid state drive, a flash memory device, etc. While one memory device 104 is shown in FIG. 1, the system 100 can include any suitable number of memory devices 104 (e.g., one memory device, two memory devices, five memory devices, ten memory devices, etc.). The processor 102 and the memory device 104 can be centralized (within one such housing) or decentralized (within two or more of such housings, which are physically distinct). In some implementations, the processor 102 and the memory device 104 are collectively referred to as a controller.

The power supply 106 generally provides electrical power to the components of the system 100 and can be, for example, a battery power supply, a direct current (DC) power supply, an alternating current (AC) power supply (e.g., including an AC/DC converter), or any combination thereof. As described in further detail herein, the power supply 106 can be used to generate a voltage potential between components of the system 100 (e.g., between the nozzle 120 and the shutter plate 140, between electrode pads of each actuator 150, etc.)

In some implementations, the system 100 optionally includes one or more sensors 108 that output sensor data that is received and stored in the memory device 104 and/or one or more other memory devices. The one or more sensors 108 can include, for example, an optical sensor, a pressure sensor, an air pressure sensor, a flow rate sensor, a temperature sensor, a force sensor, a capacitive sensor, or any combination thereof. The one or more sensors 108 can be used, for example, to determine a current position of the shutter plate 140 (e.g., relative to the nozzle 120), a flow rate of vaporized organic molecules and/or carrier gas, a pressure of vaporized organic molecules and/or carrier gas, a temperature of vaporized organic molecules and/or carrier gas, or any combination thereof.

Figure 2:
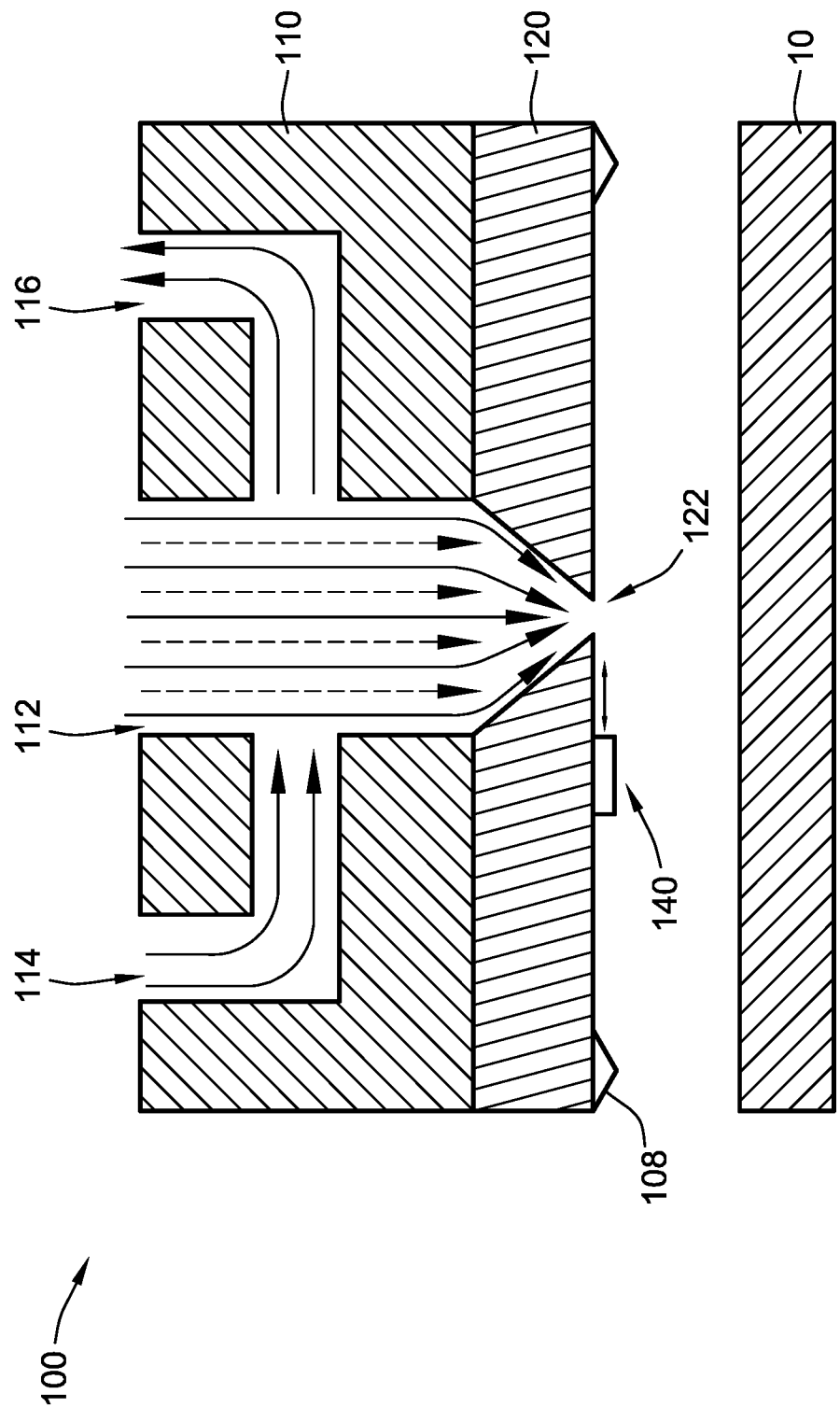
FIG. 2 is a partial cross-sectional view of select exemplary features from FIG. 1, according to some implementations of the present disclosure.

The organic vapor jet printing (OVJP) print head 110 is generally used to provide vaporized organic molecules under pressure for deposition onto a substrate. As described herein, the OVJP technique evaporates organic molecules (e.g., using a heat source) into an inert carrier gas, which aids in delivering the organic molecules to the substrate. Referring to FIG. 2, the OVJP print head 110 includes an organic molecule inlet 112 for receiving the vaporized organic molecules and carrier gas, a dilution gas inlet 114, and an exhaust outlet 116. As described in further detail herein, the exhaust outlet 116 can be used to divert the organic molecules and carrier gas out of the OVJP print head 110 if the nozzle 120 is blocked (e.g., by the shutter plate 140). The dilution gas inlet 114 and the exhaust outlet 116 can collectively dilute the output and control pressure, thereby controlling the flow rate through the aperture 122 of the nozzle 120.

The nozzle 120 is coupled to the OVJP print head 110 and is generally used to discharge a fluid (e.g., gas, vapor, liquid, or plasma). For example, the nozzle 120 can aid in directing or discharging the organic molecules from the OVJP print head 110 onto a substrate 10 for deposition. As shown in FIG. 2, the nozzle 120 has an inwardly tapered central aperture terminating at a discharge aperture 122 for directing the organic molecules from the OVJP print head 110 onto the substrate 10. The discharge aperture 122 is generally sized and shaped such that the organic molecules can be precisely deposited on one or more predetermined locations on the substrate 10 (e.g., the organic molecules deposited on the substrate within a predetermined micron-scale area or boundary) and allows a smooth, non-turbulent flow of fluid (e.g., gas). In some implementations, the nozzle 120 comprises a silicon substrate, a silicon nitride layer, a silicon oxide layer, or any combination thereof. In such implementations, the discharge aperture 122 can be formed using a silicon deep reactive ion etch technique on the silicon substrate (e.g., using a photoresist on the silicon substrate) and using focused ion beam (FIB) milling on the silicon nitride and silicon oxide layers.

Referring back to FIG. 1, in some implementations, the system 100 optionally includes a pull-down electrode pad 130 that is coupled to a surface of the nozzle 120. As described in further detail herein, in such implementations, the pull-down electrode pad 130 is positioned relative to the shutter plate 140 (e.g., between the nozzle 120 and the shutter plate 140) and is electrically coupled to the power supply 106 (e.g., via an electrical trace or wire) such that the power supply 106 can generate a voltage potential between the pull-down electrode pad 130 and the shutter plate 140, thereby moving the shutter plate 140 relative to the pull-down electrode pad 130 along a longitudinal or vertical axis (e.g., moving the shutter plate 140 towards the pull-down electrode pad 130 or away from the pull-down electrode pad 130).

The shutter plate 140 is generally used to selectively control the flow of organic molecules and carrier gas from the nozzle 120. Referring to FIG. 2, the shutter plate 140 is generally positioned between the nozzle 120 and the substrate 10. The shutter plate 140 is moveable relative to the nozzle 120 responsive to one or more inputs (e.g., a mechanical input, an electrical input, a magnetic input, or any combination thereof). For example, in some implementations, the shutter plate 140 is moveable between a first position relative to the nozzle 120 and a second position relative to the nozzle 120. In the first position, the shutter plate 140 permits the organic molecules from the OVJP print head 110 to flow through the nozzle 120 and onto the substrate 10 (FIG. 2) for deposition. In the second position, at least a portion of the shutter plate 140 inhibits the organic molecules from the OVJP print head 110 from flowing through the discharge aperture 122 of the nozzle and being depositing onto the substrate 10 (FIG. 2) by blocking the discharge aperture 122 of the nozzle 120.

Referring back to FIG. 1, in some implementations, the system 100 includes a plurality of actuators 150 for providing a mechanical input to cause the shutter plate 140 to move relative to the nozzle 120. The plurality of actuators 150 can include, for example, electrostatic actuators powered or actuated responsive to a voltage potential provided by the power supply 106. Alternative, the plurality of actuators 150 can include electrostatic actuators, electromagnetic actuators, thermal bimorph actuators, pressure and/or thermal expansion actuators, or any combination thereof. Each of the plurality of actuators can act independently or cooperatively to move the shutter plate 140. For example, in some implementations, a first actuator pulls the shutter plate 140 in a first direction towards the first actuator responsive to a first voltage input, and a second actuator pulls the shutter plate in a second opposing direction towards the second actuator and away from the first actuator responsive to a second voltage input. Alternatively, in other implementations, a first actuator pushes the shutter plate 140 in a first direction away the first actuator responsive to a first voltage input, and a second actuator pushes the shutter plate in a second opposing direction away the second actuator responsive to a second voltage input. In still other implementations, a first actuator can pull the shutter plate 140 towards itself while a second actuator simultaneously pushes the shutter plate 140 towards the first actuator. The plurality of actuators 150 can include any suitable number of actuators, such as, for example, two actuators, three actuators four actuators, ten actuators, etc.

In such implementations, the system 100 also includes a plurality of tethers 160 for coupling the shutter plate 140 to the plurality of actuators 150 such that actuation or movement of the plurality of actuators 150 causes corresponding movement of the shutter plate 140. The plurality of tethers 160 can include flexible tethers, rigid tethers, or a combination thereof, and any suitable number of tethers (e.g., two tethers, three tethers, four tethers, six tethers, twelve tethers, etc.) In some implementations, the plurality of tethers 160 and the shutter plate 140 are unitary and/or monolithic. In other implementations, the plurality of tethers 160 and the shutter plate 140 are separate and distinct components that are coupled together (e.g., via welding, an adhesive, etc.). As described in further detail, the plurality of tethers 160 can include flexible tethers, rigid tethers, or a combination thereof. The plurality of tethers 160 are substantially inelastic (e.g., such that movement of the shutter plate 140 does not cause the tethers 160 to stretch).

In some implementations, the system 100 includes one or more rails 170 that are positioned relative to the shutter plate 140 such that the one or more rails 170 aids in inhibiting movement of the shutter plate 140 along the longitudinal axis away from the nozzle 120. As described in further detail herein, the pressurized organic molecules and carrier gas from the OVJP print head 110 bias the shutter plate 140 to move away from the nozzle 120 and the OVJP print head 110. The one or more rails 170 counteract that pressure to aid in maintaining the shutter plate 140 within a predetermined distance from the nozzle 120 (e.g., an upper surface of the shutter plate 140 directly abuts a lower surface of the nozzle 120; an upper surface of the shutter plate 140 is separated by a predetermined distance from a lower surface of the nozzle 120).

In some implementations, the system 100 includes one or more magnets 180 that are coupled to (e.g., directly or indirectly) or integrated in the shutter plate 140. As described herein, the shutter plate 140 is moveable relative the nozzle 120 responsive to an input. In some implementations, the input is a magnetic field. In such implementations, the magnetic field interacts with the magnet(s) 180 coupled to or integrated in the shutter plate 140 and/or the pull-down electrode pad 130 such that magnetic forces cause the shutter plate 140 to move relative to the nozzle 120 within a horizontal plane. For example, the magnets 180 can be coupled to the shutter plate 140 using an adhesive connection (e.g., the magnet(s) 180 are dipped in UV glue or epoxy that is cured when exposed to UV light). The magnets 180 can be used instead of the actuators 150 to move the shutter plate 140 (e.g., the system 100 does not include the actuators 150), or conjunction with the actuators 150 to move the shutter plate 140.

While the system 100 is shown as including all of the components described above, more or fewer components can be included in a system for selectively depositing organic material on a substrate according to implementations of the present disclosure. For example, a first alternative system includes the nozzle 120, the pull-down electrode pad 130, the shutter plate 140, the actuators 150, and the tethers 160. As another example, a second alternative system includes the processor 102, the memory device 104, the power supply 106, the OVJP print head 110, the nozzle 120, the pull-down electrode pad 130, the shutter plate 140, the actuators 150, the and tethers 160. As yet another example, a third alternative system includes the nozzle 120, the shutter plate 140, the tethers 160, and the one or more magnets 180. Thus, various systems for selectively depositing or writing organic material onto a substrate can be formed using any portion or portions of the components shown and described herein and/or in combination with one or more other components.

Referring generally to FIGS. 3A-4B, a microelectromechanical (MEMS) system 300 that is the same as, or similar to, the system 100 includes a nozzle 320, a shutter plate 340, a plurality of actuators 350A-350B, and a plurality of tethers 360A-360B. The nozzle 320 is coupled to an OVJP print head that is the same as, or similar to, the OVJP print head 110 (FIG. 1) described above and is configured to deposit or write organic material (e.g., molecules) onto a substrate (e.g., that is the same as, or similar to, the substrate 10 (FIG. 2).

Figure 4B:
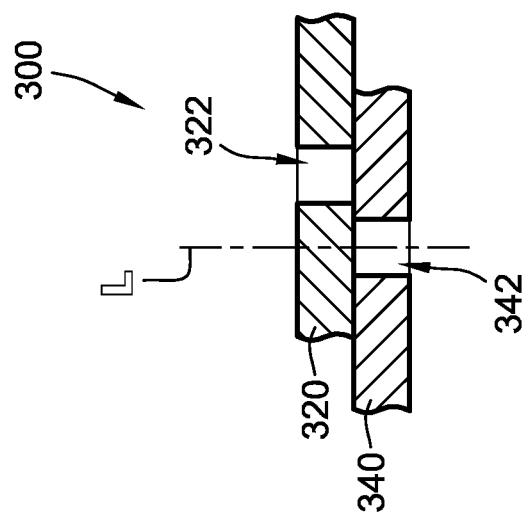
FIG. 4B is a partial side view of the MEMS system of FIG. 3A with the shutter plate in a closed position along the longitudinal axis, according to some implementations of the present disclosure.
Figure 4A:
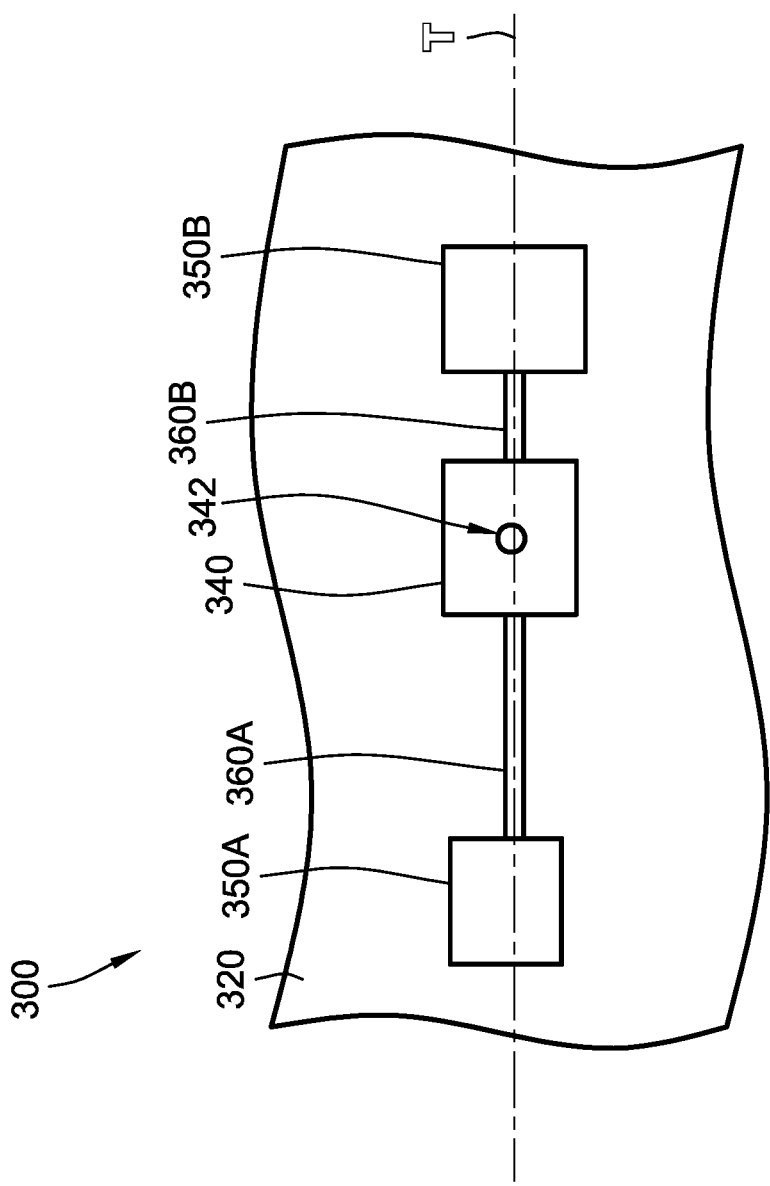
FIG. 4A is a plan view of the MEMS system of FIG. 3A with the shutter plate in an offset position along the transverse axis, according to some implementations of the present disclosure.

As shown in FIGS. 3A and 4A, a first actuator 350A of the plurality of actuators 350A-350B is coupled to the shutter plate 340 via a first tether 360A of the plurality of tethers 360A-360B. In some implementations, the first tether 360A, the first actuator 350A, and the shutter plate 340 can coupled together such that any combination of the first tether 360A, the first actuator 350A, and the shutter plate 340 are unitary and/or monolithic. Similarly, a second actuator 350B of the plurality of actuators 350A-350B is coupled to the shutter plate 340 via a second tether 360B of the plurality of tethers 360A-360B.

The first actuator 350A and the second actuator 350B provide a mechanical input to cause the shutter plate 340 to move within a horizontal plane, for example, along a transverse axis T of the shutter plate 340. The first actuator 350A and the second actuator 350B cause the shutter plate 340 to move the shutter plate 340 along the transverse axis T in a first direction towards the first actuator 350A, or in a second opposing direction towards the second actuator 350B. For example, the first actuator 350A and the second actuator 350B can cause the shutter plate 340 to move from an open position relative to the nozzle 320 (FIG. 3A) to an offset position relative to the nozzle 320 (FIG. 4A) along the transverse axis T, and vice versa. In the open position (FIG. 3A) along the transverse axis T, a central axis of the aperture 342 of the shutter plate 340 is aligned with a central axis of the aperture 322 of the nozzle 320, as shown in FIG. 3B. Conversely, in the offset position (FIG. 4A) along the transverse axis T, the central axis of the aperture 342 of the shutter plate 340 is not aligned with (e.g., is offset from) the central axis of the aperture 322 of the nozzle 320, as shown in FIG. 4B.

As shown in FIGS. 3B and 4B, the shutter plate 340 is also moveable relative to the nozzle 320 responsive to an input within a vertical plane, for example, along a longitudinal axis L. The longitudinal axis is generally perpendicular to the transverse axis H (FIGS. 3A and 4A). More specifically, the shutter plate 340 is movable relative to the nozzle 320 along the longitudinal axis L in a direction towards the nozzle 320, or in a second opposing direction away from the nozzle 320. For example, the shutter plate 340 can move from a spaced position relative to the nozzle 320 (FIG. 3B) to a closed position relative to the nozzle 320 (FIG. 4B) along the longitudinal axis L, and vice versa. In the spaced position along the longitudinal axis L relative to the nozzle 320 (FIG. 3B), the shutter plate 340 is spaced from the nozzle 320. The spacing between the nozzle 320 and the shutter plate 340 aids the actuators 350A-350B (FIGS. 3A and 4A) in moving the shutter plate 340 between the open position (FIG. 3A) and the offset position (FIG. 4A) along the transverse axis T because there is no friction between surfaces of the nozzle 320 and the shutter plate 340. In the closed position along the longitudinal axis L relative to the nozzle 320 (FIG. 4B), at least a portion of a surface of the shutter plate 340 is in contact (e.g., directly abuts) at least a portion of a surface of the nozzle 320.

In some implementations, the input that causes the shutter plate 340 to move along the longitudinal axis is a voltage potential between the nozzle 320 and the shutter plate 340. In other implementations, at least a portion of the shutter plate 340 and/or the nozzle 320 comprises a magnetic material, and the input that causes the shutter plate 340 to move along the longitudinal axis is a magnetic field. In such implementations, the interaction between the magnetic field and the magnetic material generates force(s) that cause the shutter plate 340 to move away from, or towards, the nozzle 320. In still other implementations, the input causes the shutter plate 340 to move along the longitudinal axis is a mechanical input.

When the shutter plate 340 is in the open position along the transverse axis T (FIG. 3A) and the spaced position along the longitudinal axis L (FIG. 3B), the aperture 322 of the nozzle 320 and the aperture 342 of the shutter plate 340 are relatively positioned such that the aperture 322 of the nozzle 320 and the aperture 342 of the shutter plate 340 are in fluid communication with one another. This allow fluid (e.g., gas, vapor, organic molecules and a carrier gas, etc.) from an OVJP print head coupled to the nozzle 320 to flow through the aperture 342 of the shutter plate 340 and onto a substrate.

When the shutter plate 340 is in the offset position along the transverse axis T (FIG. 3A) and the closed position along the longitudinal axis L (FIG. 3B), the aperture 322 of the nozzle 320 and the aperture 342 of the shutter plate 340 are relatively positioned such that there is no overlap therebetween. As shown in FIG. 4B, because at least a portion of the shutter plate 340 is in contact (e.g., directly abuts) at least a portion of the nozzle 320 the aperture 322 of the nozzle 320 and the aperture 342 of the shutter plate 340 are not in fluid communication with one another, thereby preventing fluid (e.g., organic molecules and a carrier gas) from the OVJP print head coupled to the nozzle 320 to flow through the aperture 342 of the shutter plate 340 and onto a substrate. In this manner, the shutter plate 340 can be selectively moved relative to the nozzle 320 to precisely control the flow of fluid (e.g., organic molecules) from the nozzle 320 and onto the substrate.

Figure 5A:
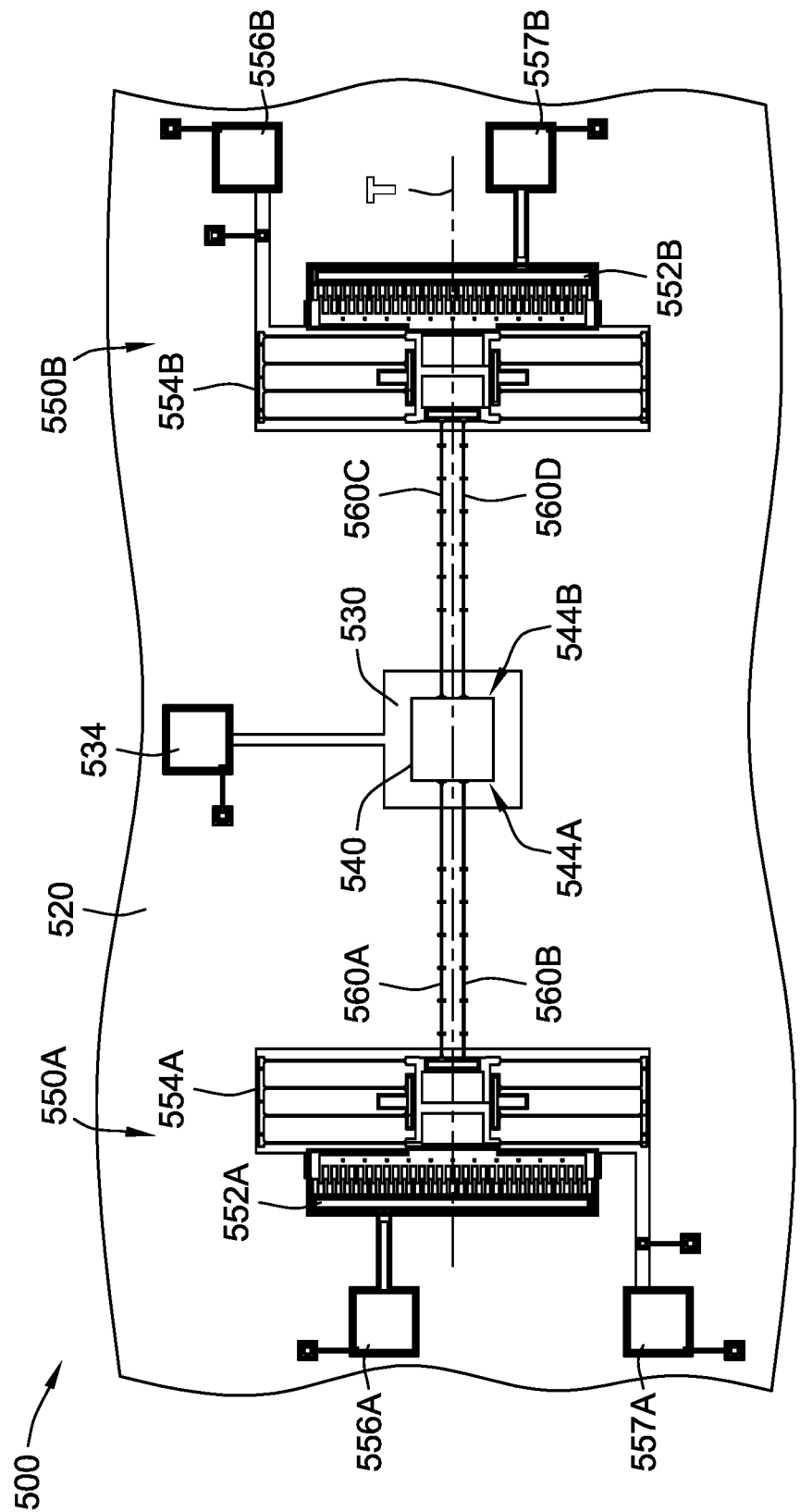
FIG. 5A is a plan view of a microelectromechanical (MEMS) system including a plurality of flexible tethers, according to some implementations of the present disclosure.
Figure 5B:
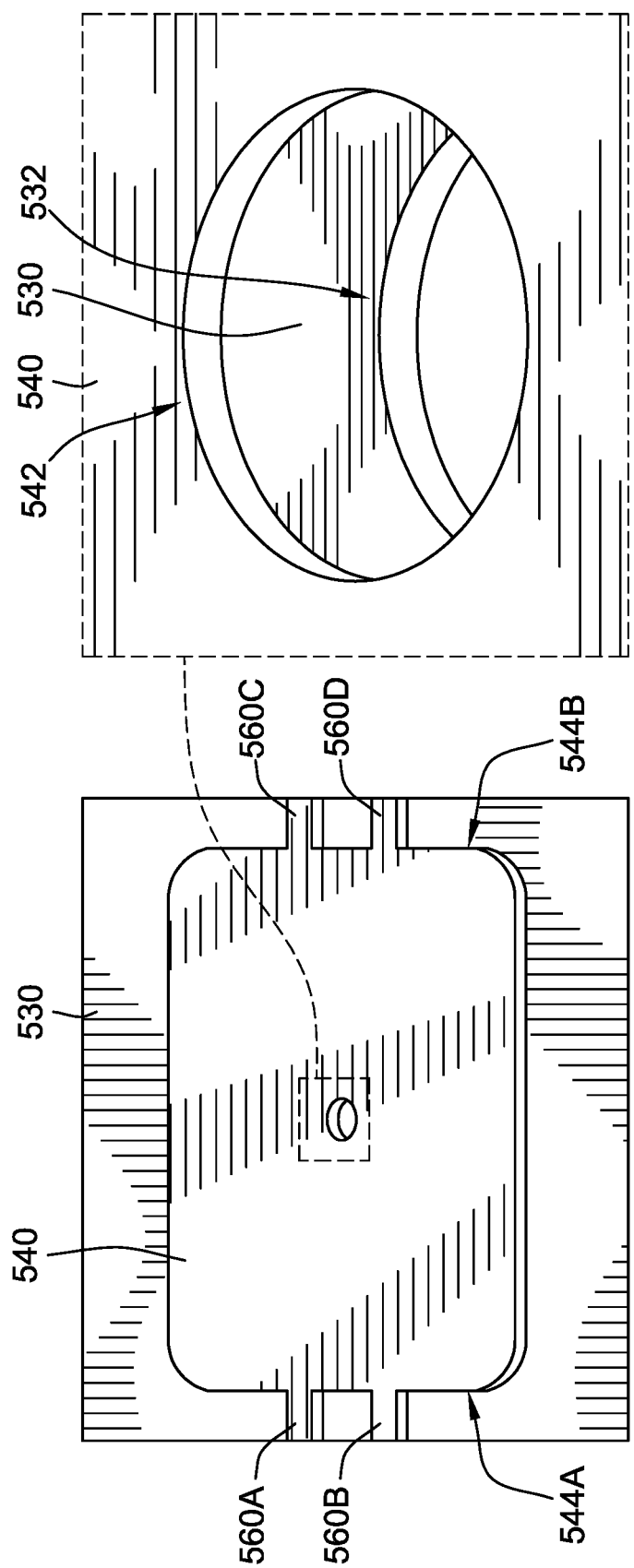
FIG. 5B is a zoomed-in perspective view of a shutter plate of the MEMS system of FIG. 5A, according to some implementations of the present disclosure.
Figure 5C:
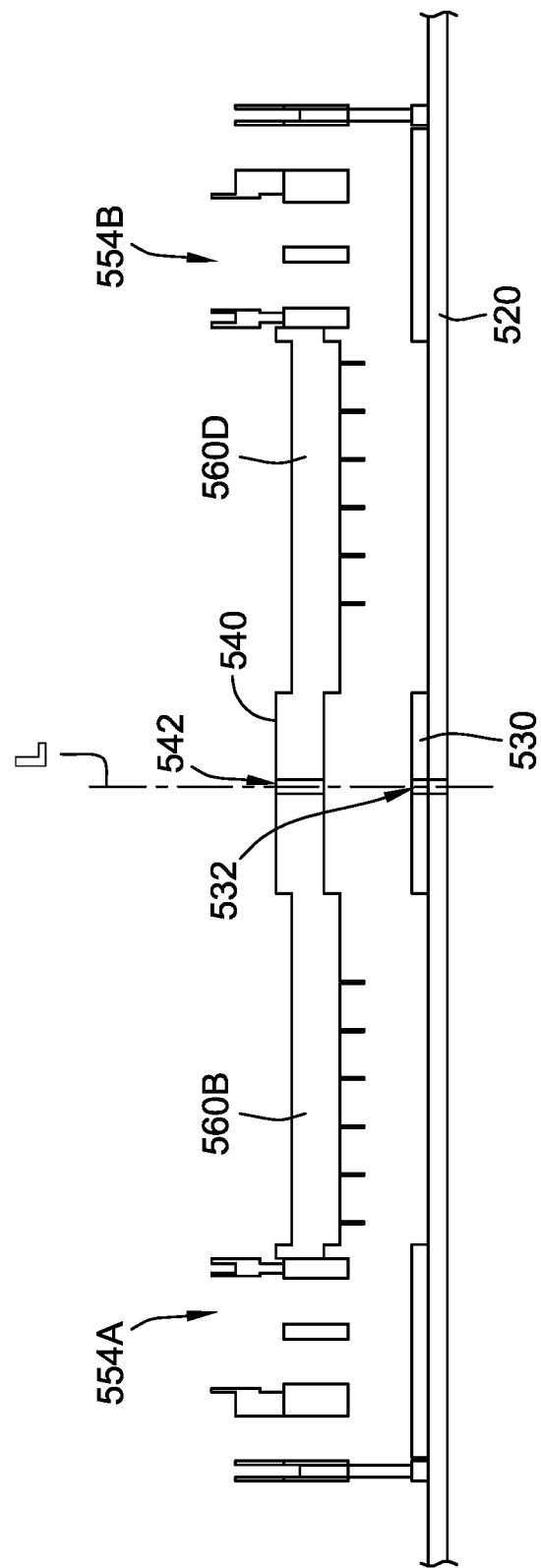
FIG. 5C is a cross-sectional view of the MEMS system of FIG. 5A, according to some implementations of the present disclosure.

Referring generally to FIGS. 5A-5C, a microelectromechanical (MEMS) system 500 that is similar to the system 100 and the system 300 includes a nozzle 520 (FIG. 5C), a pull-down electrode pad 530, a shutter plate 540, a plurality of electrostatic actuators 550A-550B, and a plurality of flexible tethers 560A-560D.

The pull-down electrode pad 530 is the same as, or similar to, the pull-down electrode pad 130 (FIG. 1) and can be coupled to or integrated in the nozzle 520 (FIG. 5C) that is the same as, or similar to, the nozzle 120 (FIG. 1) of the system 100. As shown in FIG. 5A, the pull-down electrode pad 530 is electrically coupled to an electrode pad 534, which is in turn electrically coupled to a power supply that is the same as, or similar to, the power supply 106 (FIG. 1). The power supply can generate a voltage potential between the pull-down electrode pad 530 and the shutter plate 540 to generate electrostatics forces for causing movement of the shutter plate 540 relative to the pull-down electrode pad 530 (e.g., moving the shutter plate 540 towards the pull-down electrode pad 530 or moving the shutter plate 540 away from the pull-down electrode pad 530). As shown in FIGS. 5B and 5C, the pull-down electrode pad 530 also includes a generally central discharge aperture 532.

The shutter plate 540 is the same as, or similar to, the shutter plate 140 (FIG. 1) and the shutter plate 340 (FIGS. 3A-4B) and includes an aperture 542 (FIGS. 5B and 5C). The aperture 542 is generally circular and positioned relative to the first edge 544A and the second edge 544B of the shutter plate 540 such that aperture 542 is centrally located on the shutter plate 540. In some implementations, the aperture 542 is formed in the shutter plate 540 using a focused ion beam (FIB) technique and has a diameter that is between about 2 microns and about 20 microns, between about 5 microns and about 15 microns, between about 8 microns and about 12 microns, etc. Similarly, as best shown in FIG. 5C, the discharge aperture 532 of the pull-down electrode pad 530 has substantially the same size and shape as the aperture 542 of the shutter plate 540.

As shown in FIG. 5A, the plurality of actuators 550A-550B includes a first actuator 550A and a second actuator 550B. The first actuator 550A includes a first comb drive 552A and a first folded beam suspension 554A. The first comb drive 552A includes a pair of combs with interleaved or interlocking fingers that move relative to one another responsive to a voltage potential. The folded beam suspension 554A acts as a linear spring to aid in translating movement from the comb drive 552A into linear movement of the shutter plate 540 along the transverse axis. The first linear actuator 550A also includes a first electrode pad 556A and a second electrode pad 557A that can be electrically coupled to a power supply (e.g., that the same as, or similar to, the power supply 106 (FIG. 1)) to provide a voltage potential to actuate the first comb drive 552A. The second actuator 550B is the same as, or similar to, the first actuator 550A and includes a second comb drive 552B and a second folded beam suspension 554B that are the same as, or similar to, the first comb drive 552A and the first folded beam suspension 554A, respectively.

The plurality of flexible tethers 560A-560D includes a first flexible tether 560A, a second flexible tether 560B, a third flexible tether 560C, and a fourth flexible tether 560D. As shown in FIGS. 5A and 5B, the first flexible tether 560A and the second flexible tether 560B are coupled to and extend between a first edge 544A of the shutter plate 540 and the first folded beam suspension 554A. Similarly, the flexible third tether 560C and the flexible fourth tether 560D are coupled to and extend between a second opposing edge 544B of the shutter plate 540 and the second folded beam suspension 554B. The flexible tethers 560A-560D can exert forces that are between, for example, about 0.1 mN and about 5 mN, between about 0.5 mN and about 5 mN, about 1 mN, etc.

Like the shutter plate 340 of the system 300 (FIGS. 3A-4B), the shutter plate 540 is movable relative to the pull-down electrode pad 530 along a transverse axis T (FIG. 5A) towards the second electrostatic actuator 550B, or in the opposite direction towards the first electrostatic actuator 550A responsive to a mechanical input from the first electrostatic actuator 550A and/or the second electrostatic actuator 550B (e.g., the first electrostatic actuator 550A pushes the shutter plate 540, while the second electrostatic actuator 550B pulls the shutter plate 540, or vice versa). Relative to the position of the shutter plate 540 shown in FIG. 5A, the shutter plate 540 can move towards the second electrostatic actuator 550B, or towards the first electrostatic actuator 550A, by a predetermined distance that is, for example, between about 0.1 microns and about 25 microns, between about 1 micron and about 20 microns, between about 5 microns and about 15 microns, about 18 microns, etc. The shutter plate 540 can move towards the second electrostatic actuator 550B or towards the first electrostatic actuator 550A at a predetermined speed that is, for example, between about 1 cm/s and about 1 m/s.

Further, like the shutter plate 340 of the system 300 (FIGS. 3A-4B), the shutter plate 540 is movable relative to the pull-down electrode pad 530 along a longitudinal axis L (FIG. 5C) towards the pull-down electrode pad 530 or away from the pull-down electrode pad 530. For example, as shown in FIG. 5C, the shutter plate 540 can be spaced from the pull-down electrode pad 530 such that no portion or surface of the shutter plate 540 is in direct contact with a portion or surface of the pull-down electrode pad 530. Because there is no friction (e.g., static or dynamic) between the shutter plate 540 and the pull-down electrode pad 530 in this position (FIG. 5C), the shutter plate 540 can more easily move along the transverse axis T (FIG. 5A) relative to the pull-down electrode pad 530.

Figure 6:
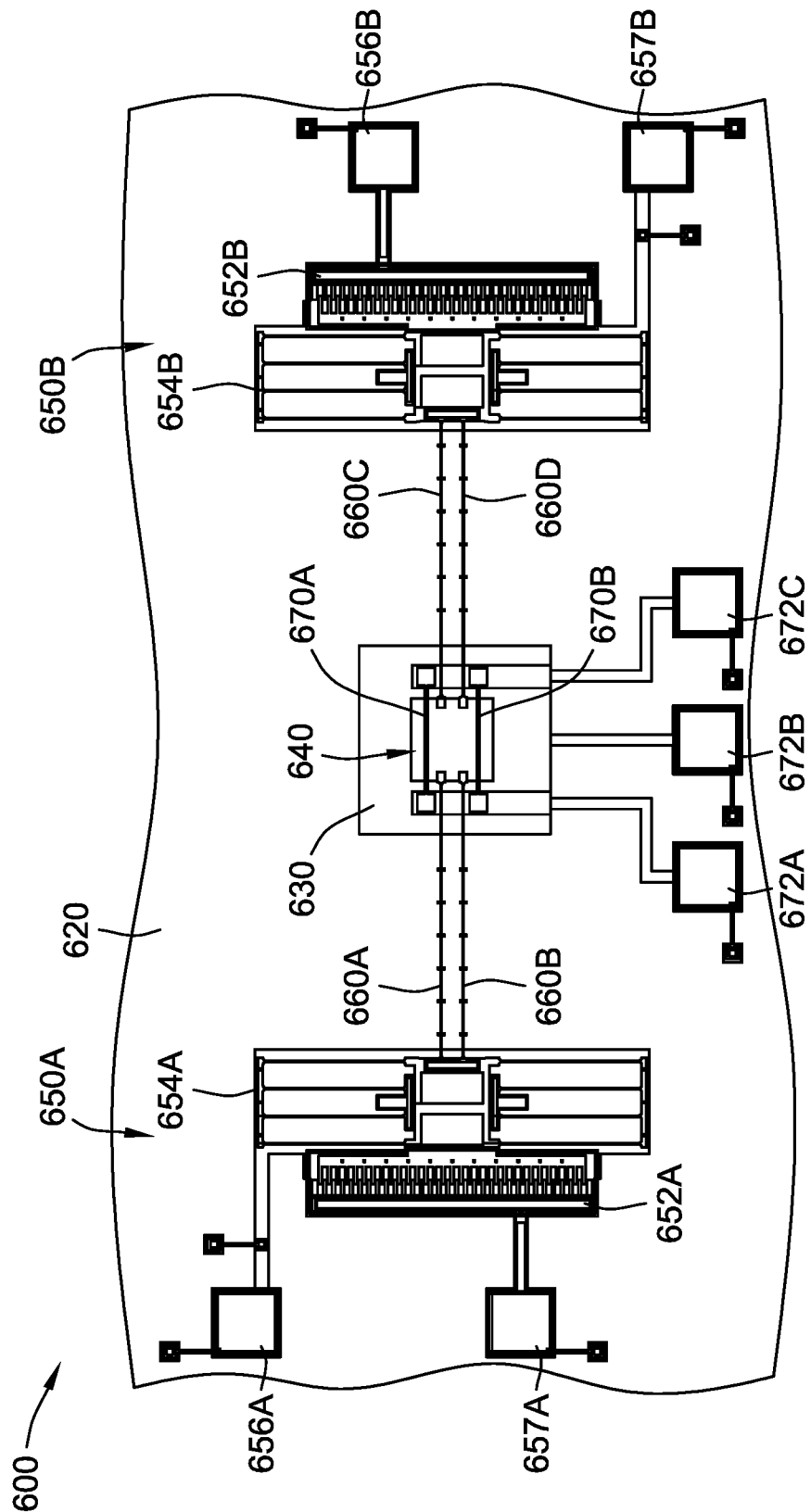
FIG. 6 is a plan view of a microelectromechanical (MEMS) system including a plurality of flexible tethers and a plurality of rails, according to some implementations of the present disclosure.

Referring to FIG. 6, a microelectromechanical (MEMS) system 600 that is the same as, or similar to, the system 500 includes a nozzle 620, a pull-down electrode pad 630, a shutter plate 640, a plurality of electrostatic actuators 650A-650B, a plurality of flexible tethers 660A-660D, and a plurality of rails 670A-670B.

The nozzle 620 is the same as, or similar to, the nozzle 520 (FIG. 5A). Likewise, the pull-down electrode pad 630 is the same as, or similar to, the pull-down electrode pad 530 (FIG. 5A) of the system 500 and is electrically coupled to an electrode pad 672B that is the same as, or similar to, the electrode pad 534 (FIG. 5A). The shutter plate 640 is the same as, or similar to, the shutter plate 540 of the system 500. The plurality of electrostatic actuators 650A-650B are the same as, or similar to, the electrostatic actuators 550A-550B (FIG. 5A) and include a first electrostatic actuator 650A having a first comb drive 652A and a first folded beam suspension 654B and a second electrostatic actuator 650B having a second comb drive 652B and a second folded beam suspension 654B. The first electrostatic actuator 650A is coupled to a first pair of electrode pads 656A-657A, while the second electrostatic actuator 650B is coupled to a second pair of electrode pads 656B-657B.

The system 600 differs from the system 500 in that the system 600 includes the plurality of rails 670A-670B. As shown, a first rail 670A and a second rail 670B extend generally parallel to the plurality of flexible tethers 660A-660D across the shutter plate 640. Each of the first rail 670A and the second rail 670B have a first end coupled to the pull-down electrode pad 630 adjacent to a first edge of the shutter plate 640 and a second opposing end coupled to the pull-down electrode pad 630 adjacent to a second opposing edge of the shutter plate 640. The first rail 670A and the second rail 670B are generally used to restrain or inhibit movement of the shutter plate 640 out of the horizontal plane relative to the pull-down electrode pad 630 (e.g., restrain or inhibit movement along a longitudinal axis relative to the pull-down electrode pad 630). For example, if the pressure of the organic material and carrier gas from an OVJP print head is too high (e.g., greater than 100 PSI), the pressure can bias the shutter plate 640 away the pull-down electrode pad 630 such that it is difficult or impossible for the system 600 to move the shutter plate 640 towards the pull-down electrode pad 630, or even cause one or more of the flexible tethers 660A-660D to fail (e.g., fracture). The rails 670A-670B are positioned relative to the shutter plate 640 such that the rails 670A-670B resist forces biasing the shutter plate 640 away from the pull-down electrode pad 630.

The first rail 670A and the second rail 670B are electrically coupled to a first electrode pad 672A and a second electrode pad 672C, which are in turn electrically coupled or connected (e.g., directly or indirectly) to a power supply (e.g., the same power supply as the first actuator 650A and/or the second actuator 650B). In some implementations, the first rail 670A and/or the second rail 670B can act as heaters by applying an electrical current through the first rail 670A and/or the second rail 670B. Heating can be useful, for example, to heat the shutter plate 640 to aid in preventing the aperture from becoming clogged. The first rail 670A and the second rail 670B can also be used as thermometers because they are made from a material whose resistance varies with temperature according to a predetermined relationship such that measuring resistance also provides temperature measurement. Measuring temperature is useful, for example, to make sure that the shutter plate 640 is not heated to too high of a temperature.

Figure 7:
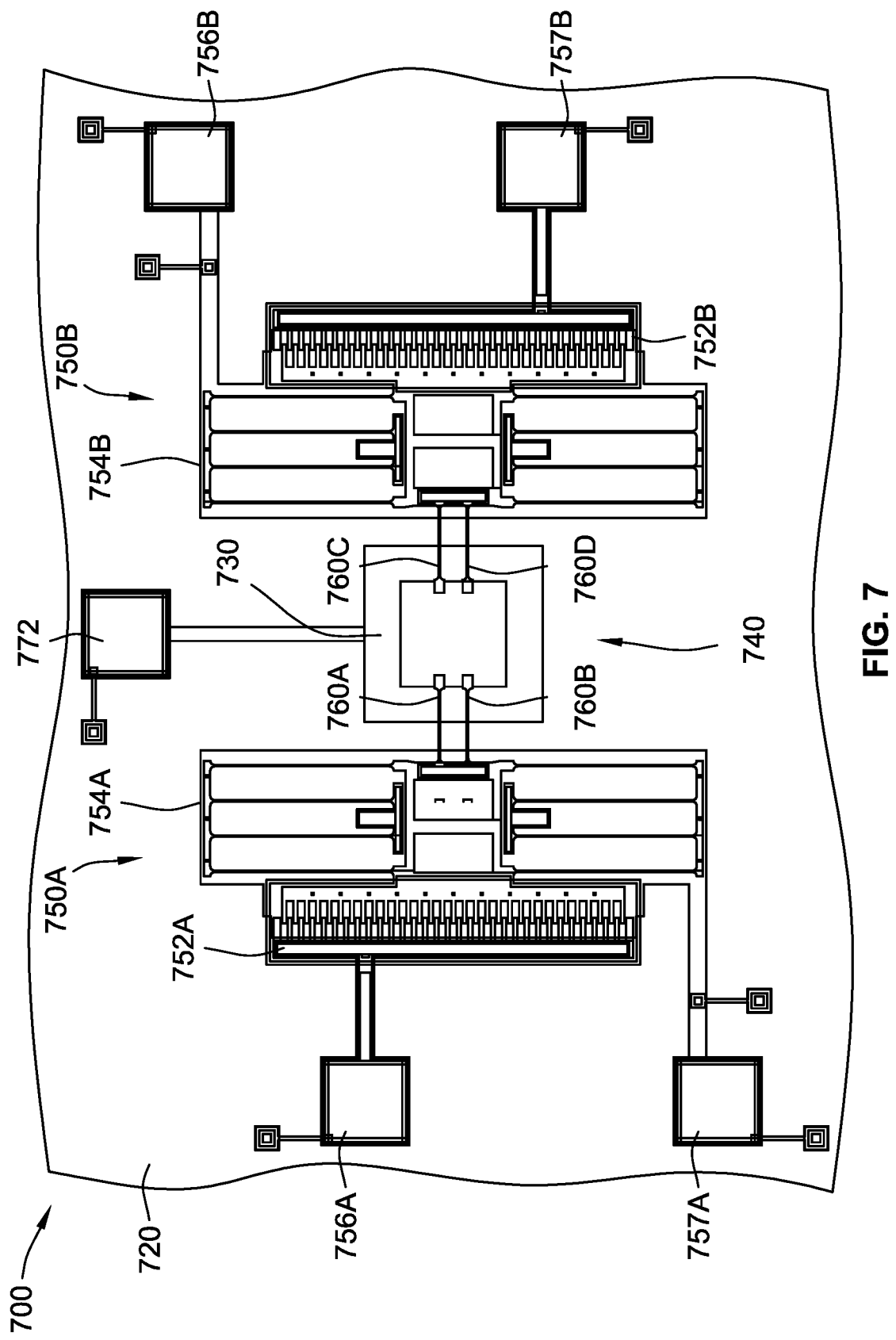
FIG. 7 is a plan view of a microelectromechanical (MEMS) system including a plurality of rigid tethers, according to some implementations of the present disclosure.

Referring to FIG. 7, a microelectromechanical (MEMS) system 700 that is the same as, or similar to, the system 500 (FIGS. 5A-5C) includes a nozzle 720, a pull-down electrode pad 730, a shutter plate 740, and a plurality of electrostatic actuators 750A-750B.

The nozzle 720 is the same as, or similar to, the nozzle 520 (FIG. 5A). Likewise, the pull-down electrode pad 730 is the same as, or similar to, the pull-down electrode pad 530 (FIG. 5A) of the system 500 and is electrically coupled to an electrode pad 772 that is the same as, or similar to, the electrode pad 534 (FIG. 5A). The shutter plate 740 is the same as, or similar to, the shutter plate 740 of the system 500. The plurality of electrostatic actuators 750A-750B are the same as, or similar to, the electrostatic actuators 550A-550B (FIG. 5A) and include a first electrostatic actuator 750A having a first comb drive 752A and a first folded beam suspension 754B and a second electrostatic actuator 750B having a second comb drive 752B and a second folded beam suspension 754B. The first electrostatic actuator 750A is coupled to a first pair of electrode pads 756A-757A, while the second electrostatic actuator 750B is coupled to a second pair of electrode pads 756B-757B.

The system 700 differs from the system 500 in that the system 700 includes a plurality of rigid tethers 760A-760D instead of the plurality of flexible tethers 560A-560D (FIG. 5A). The rigid tethers 760A-760D have a tensile strength that is between about 100 and about 1,000 times higher than that of the flexible tethers 560A-560D (FIG. 5A). In some implementations each of the rigid tethers 760A-760D (FIG. 7) has a length that is less than a length of each of the plurality of flexible tethers 560A-560D (FIG. 5A). For example, each of the rigid tethers 760A-760D (FIG. 7) can have a length that is less than about half of the length of each of the plurality of flexible tethers 560A-560D (FIG. 5A). For another example, each of the rigid tethers 760A-760D (FIG. 7) can have a length that is between about 50 microns and about 200 microns, while each of the plurality of flexible tethers 560A-560D (FIG. 5A) can have a length that is between about 300 microns and about 750 microns.

Figure 8:
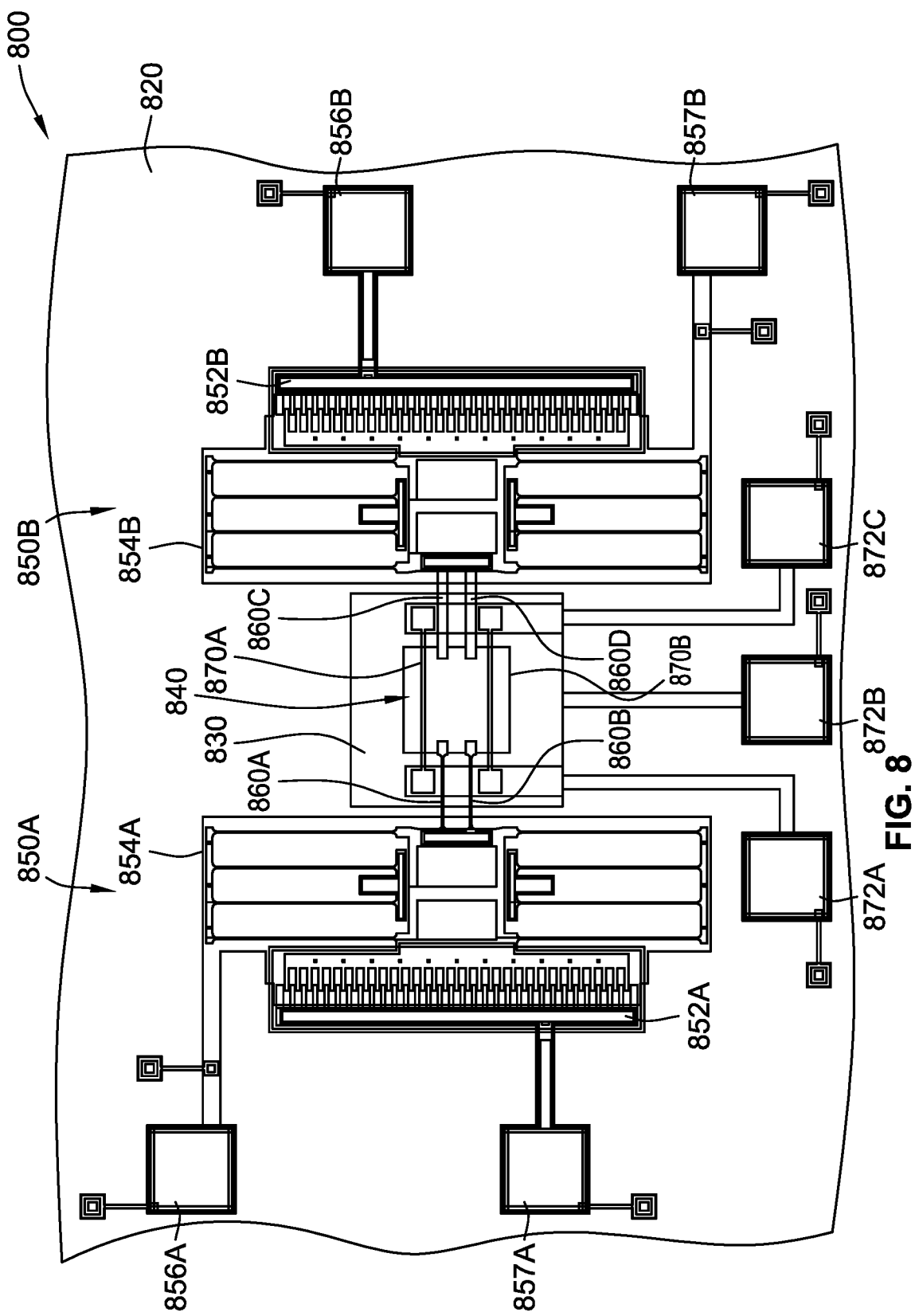
FIG. 8 is a plan view of a microelectromechanical (MEMS) system including a plurality of rigid tethers and a plurality of rails, according to some implementations of the present disclosure.

Referring to FIG. 8, a microelectromechanical (MEMS) system 800 that is the same as, or similar to, the system 600 (FIG. 6) includes a nozzle 820, a pull-down electrode pad 830, a shutter plate 840, a plurality of electrostatic actuators 850A-850B, and a plurality of rails 870A-870B.

The nozzle 820 is the same as, or similar to, the nozzle 620 (FIG. 6). Likewise, the pull-down electrode pad 830 is the same as, or similar to, the pull-down electrode pad 630 (FIG. 6) of the system 600 and is electrically coupled to an electrode pad 872B that is the same as, or similar to, the electrode pad 672B (FIG. 6). The shutter plate 840 is the same as, or similar to, the shutter plate 640 of the system 600. The plurality of electrostatic actuators 850A-850B are the same as, or similar to, the electrostatic actuators 650A-650B (FIG. 6) and include a first electrostatic actuator 850A having a first comb drive 852A and a first folded beam suspension 854B and a second electrostatic actuator 850B having a second comb drive 852B and a second folded beam suspension 854B. The first electrostatic actuator 850A is coupled to a first pair of electrode pads 856A-857A, while the second electrostatic actuator 850B is coupled to a second pair of electrode pads 856B-857B.

The plurality of rails 870A-870B are the same as, or similar to the plurality of rails 670A-670B of the system 600 (FIG. 6). As shown, a first rail 870A and a second rail 870B extend generally parallel to the plurality of rigid tethers 860A-860D across the shutter plate 840. Each of the first rail 870A and the second rail 870B have a first end coupled to the pull-down electrode pad 830 adjacent to a first edge of the shutter plate 840 and a second opposing end coupled to the pull-down electrode pad 830 adjacent to a second opposing edge of the shutter plate 840. The first rail 870A and the second rail 870B are electrically coupled to a first electrode pad 872A and a second electrode pad 872C, which are in turn electrically coupled or connected (e.g., directly or indirectly) to a power supply (e.g., the same power supply as the first actuator 850A and/or the second actuator 850B). In some implementations, the first rail 870A and/or the second rail 870B can act as heaters and/or thermometers.

The system 800 differs from the system 600 in that the system 800 includes a plurality of rigid tethers 860A-860D instead of the plurality of flexible tethers 660A-660D (FIG. 6). The plurality of rigid tethers 860A-860D are the same, or similar to the plurality of rigid tethers 760A-760D of the system 700 (FIG. 7).

Figure 9:
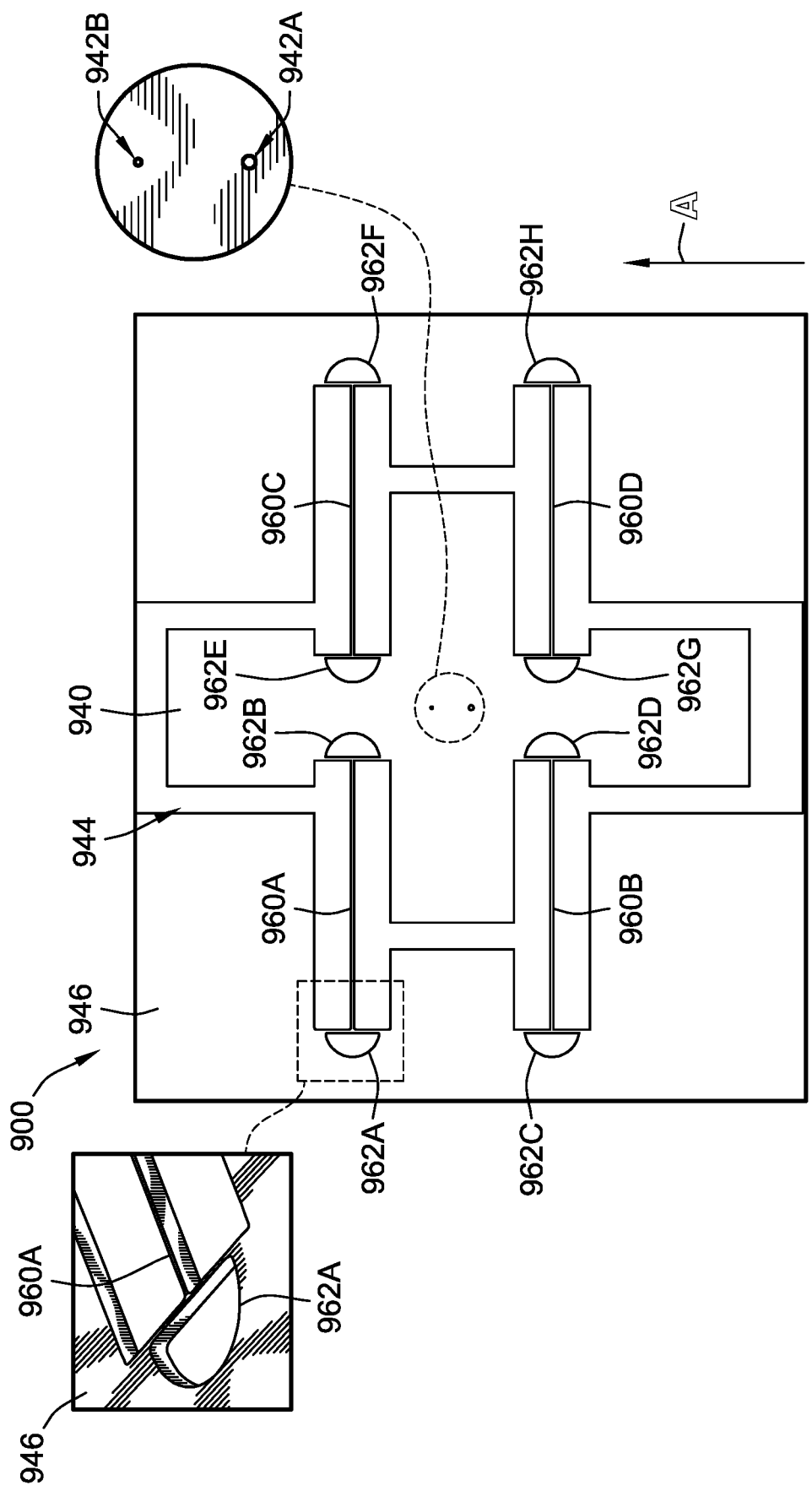
FIG. 9 is a plan view of a shutter plate of a microelectromechanical (MEMS) system, according to some implementations of the present disclosure.

Referring to FIG. 9, a microelectromechanical (MEMS) system 900 includes a shutter plate 940, a plurality of tethers 960A-960D, and a plurality of strain relief apertures 962A-962H.

The shutter plate 940 has a cross or plus (+) shape and is defined by a gap 944 between a base portion 946 and the shutter plate 940. The shutter plate 940 is coupled to the base portion 946 using the plurality of tethers 960A-960D that are the same as, or similar to, the plurality of tethers 160 (FIG. 1) of the system 100. As shown, the plurality of tethers 960A-960D includes a first tether 960A, a second tether 960B, a third tether 960C, and a fourth tether 960D.

The plurality of strain relief apertures 962A-962H are generally used to relieve strain caused by movement of the shutter plate 940. As shown, each of the plurality of strain relief apertures 962A-962H has a generally "D" or crescent shape. Pairs of the plurality of strain relief apertures 962A-962D are positioned on opposing ends of each of the plurality of tethers 960A-960D. For example, a first strain relief aperture 962A is positioned adjacent to a first end of the first tether 960A and a second strain relief aperture 962B is positioned adjacent to a second opposing end of the first tether 960A.

The shutter plate 940 includes a plurality of apertures 942A-942B, including a first aperture 942A and a second aperture 942B. The first aperture 942A has a first diameter and the second aperture 942B has a second diameter. As shown, the second diameter of the second aperture 942B is less than the first diameter of the first aperture 942A (e.g., the second diameter is about half of the first diameter). Alternatively, the first diameter of the first aperture 942A can be less than the second diameter of the second aperture 942B. Alternatively still, the first diameter and the second diameter be substantially the same (e.g., within manufacturing tolerances). While the plurality of apertures 942A-942B is shown in this example as including two apertures, more generally, the shutter plate 940 can include any suitable number of apertures (e.g., one aperture, three apertures, six apertures, ten apertures, etc.).

The shutter plate 940 includes one or more magnets that are the same as, or similar to, the magnet 180 (FIG. 1) of the system 100 described herein. The one or more magnets can be coupled to the shutter plate 940 (e.g., directly or indirectly) and/or integrated in the shutter plate 940. The one or more magnets cause the shutter plate 940 to move within the horizontal plane responsive to the application of a magnetic field in the direction of arrow A, or in the opposite direction of arrow A.

The shutter plate 940 operates in the same or similar manner as the shutter plates described herein in that shutter plate 940 can be moved in the direction of arrow A (or the opposite direction of arrow A) to a first position such that the first aperture 942A is generally aligned with a discharge aperture of a nozzle coupled to an OVJP print head, or to a second position such that the second aperture 942B is generally aligned with the discharge aperture of the nozzle. Because the first aperture 942A and the second aperture 942B have different diameters in this example, the first aperture 942A or the second aperture 942B can be selected to selectively control the deposition onto a substrate. For example, the first aperture 942A can be selected to deposit or write organic material having a first dimension (e.g., area, width, length, diameter, etc.) onto a first location on the substrate, whereas the second aperture 942B can be selected to deposit or write organic material having a second dimension onto a second location on the substrate, where the second dimension is smaller than the first dimension. In this manner, different shapes and/or sizes of organic material can be deposited onto the substrate by selecting one of the plurality of apertures 942A-942B. Like the other shutter plates described herein, the shutter plate 940 can also be moved to a third position such that a portion of the shutter plate 940 inhibits fluid from flowing through the discharge aperture of the nozzle such that the fluid is not deposited onto a substrate.

Each of the shutter plates described herein (e.g., the shutter plate 140 (FIGS. 1-2), the shutter plate 340 (FIGS. 3A-4B), the shutter plate 540 (FIGS. 5A-5C), the shutter plate 640 (FIG. 6), the shutter plate 740 (FIG. 7), the shutter plate 840 (FIG. 8), and/or the shutter plate 940 (FIG. 9)) can be fabricated using, for example, a surface micro-machine process or a silicon-on-insulator process. The surface micro-machine process includes patterning a plurality of layers onto a silicon substrate to fabricate the shutter plate. The plurality of layers can include, for example, a nitride layer, a first oxide layer, a second oxide layer, a first polymer layer, a second polymer layer, a third polymer layer, a metal layer, or any combination thereof. The silicon-on-insulator process includes providing a first silicon wafer, providing a thin oxide layer on a surface of the first silicon layer, and providing a second, thinner silicon wafer that is atomically bonded to the first silicon layer via the oxide layer. The pattern defining the shutter plate is then patterned on a surface of the second, thinner silicon wafer.

Figure 10:
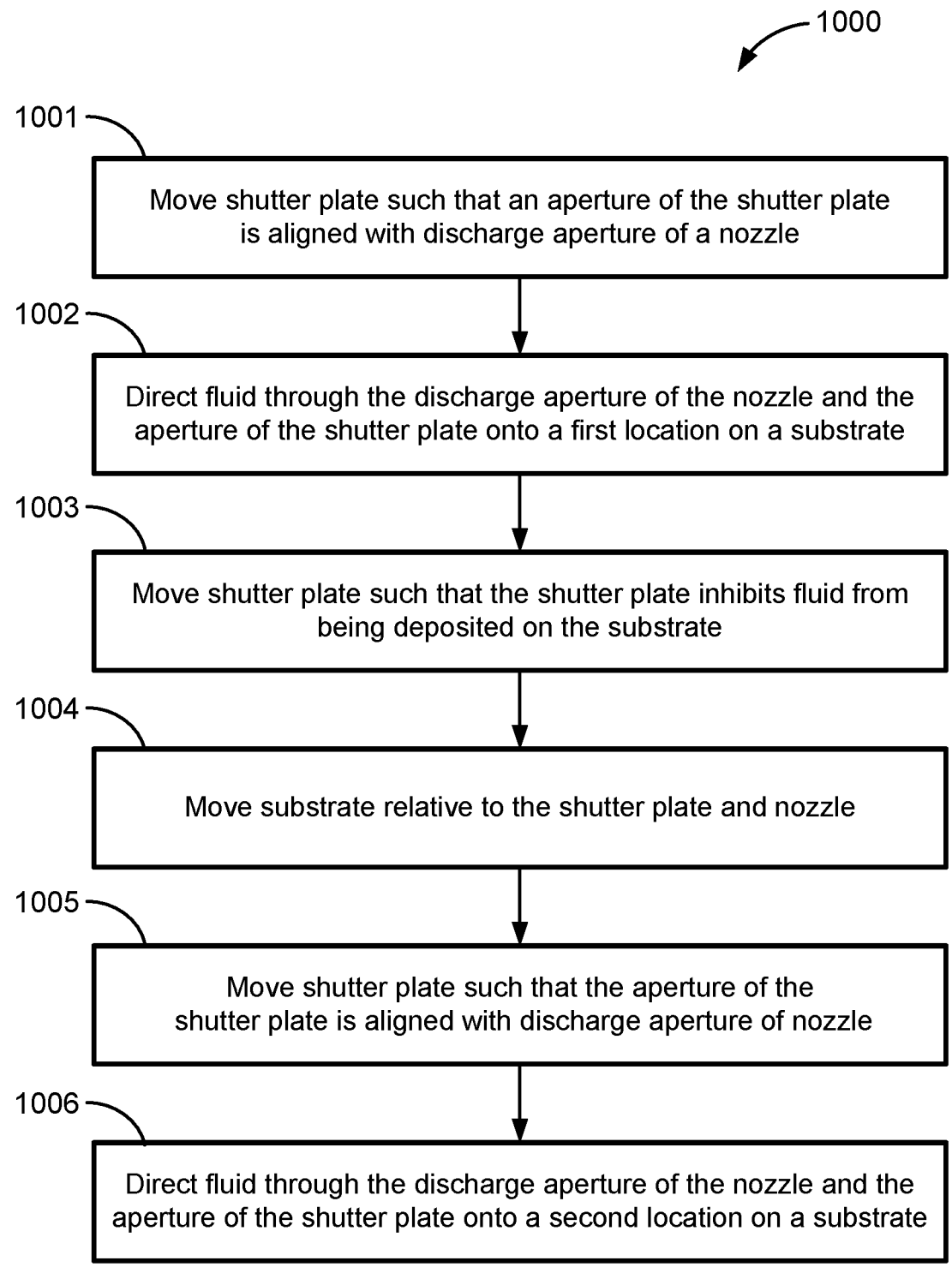
FIG. 10 is a process flow diagram for a method of selectively depositing organic material on a substrate, according to some implementations of the present disclosure.

Referring to FIG. 10, a method 1000 for depositing organic material onto a substrate is illustrated. One or more steps of the method 1000 can be implemented using any one of the devices or systems described herein, including system 100 (FIG. 1), the system 300 (FIGS. 3A-4B), the system 500 (FIG. 5), the system 600 (FIG. 6), the system 700 (FIG. 7), the system 800 (FIG. 8), and/or the system 900 (FIG. 9).

Step 1001 of the method 1000 includes moving a shutter plate such that an aperture of the shutter plate is aligned and in fluid communication with a discharge aperture of a nozzle. For example, step 1001 can include providing a mechanical input to cause the shutter plate to move relative to the nozzle (e.g., using electrostatic motors) or a magnetic field input to cause the shutter plate to move relative to the nozzle (e.g. by applying a magnetic field to one or more magnets coupled to the shutter plate).

Step 1002 of the method 1000 includes directing fluid through the discharge aperture of the nozzle and the aperture of the shutter plate onto a first location on a substrate. For example, step 1002 can include directing vaporized organic molecules and an inert carrier gas through the discharge end of the nozzle and the aperture in the shutter plate. In some implementations, the first location on the substrate has a predetermined area (e.g., 0.1 $\mu m^2$, 0.5 $\mu m^2$, 1 $\mu m^2$, 3 $\mu m^2$, 10 $\mu m^2$, etc.). In some implementations, step 1002 includes directing the fluid through the discharge aperture of the nozzle and the aperture of the shutter plate onto the first location on the substrate for a first predetermined duration (e.g., 100 μ-seconds, 0.1 seconds, 0.5 seconds, 1 second, 3 seconds, 10 seconds, 30 seconds, etc.).

Step 1003 of the method 1000 includes moving the shutter plate such that the shutter plate inhibits fluid from being deposited onto the substrate. For example, step 1003 can include providing a mechanical input to cause the shutter plate to move relative to the nozzle (e.g., using electrostatic motors) or a magnetic field input to cause the shutter plate to move relative to the nozzle (e.g. by applying a magnetic field to one or more magnets coupled to the shutter plate). In this position, the aperture of the shutter plate is not in fluid communication with the discharge aperture of the nozzle. In other words, least a portion of a surface of the shutter plate inhibits or blocks fluid from flowing through the aperture in the shutter plate and onto the substrate.

Step 1004 of the method 1000 includes moving the substrate relative to the shutter plate and/or the nozzle. For example, the substrate can be positioned on a translation stage that moves the substrate relative to the shutter plate and/or nozzle. Alternatively, in some implementations, step 1004 includes moving the nozzle and the shutter plate relative to the substrate. In such implementations, the nozzle is coupled to (e.g. directly or indirectly) a translation stage that moves the nozzle and the shutter plate relative to the substrate.

Step 1005 of the method 1000 is the same as, or similar to, step 1001 and includes moving the shutter plate such that the aperture of the shutter plate is aligned with the discharge aperture of the nozzle. For example, step 1005 can include providing a mechanical input to cause the shutter plate to move relative to the nozzle (e.g., using electrostatic motors) or a magnetic field input to cause the shutter plate to move relative to the nozzle (e.g. by applying a magnetic field to one or more magnets coupled to the shutter plate).

Step 1006 of the method 1000 includes directing fluid through the discharge aperture of the nozzle and the aperture of the shutter plate onto a second location on the substrate that is different than the first location. For example, the second location can be spaced from the first location by a predetermined distance (e.g., 0.1 μm, 0.5 μm, 1 μm, 3 μm, 5 μm, 10 μm, 100 μm, etc.) and have the same size and/or shape as the first location, or a different size and/or shape.

Steps 1001-1006 of the method 1000 can be repeated one or more times such that organic material is deposited onto any number of locations on the substrate (e.g., three locations, ten locations, fifty locations, one-hundred locations, etc.).

Alternative Implementations

Alternative Implementation 1. A microelectromechanical device includes a nozzle, a shutter plate, a plurality of tethers, and a plurality of electrostatic actuators. The nozzle includes a discharge end for discharging a fluid. The shutter plate includes an aperture. The shutter plate positioned at the discharge end of the nozzle. The plurality of tethers are coupled to the shutter plate. Each of the plurality of electrostatic actuators are coupled to one or more of the plurality of tethers. The plurality of electrostatic actuators are configured to move the shutter plate between an open position and a closed position relative the discharge end of the nozzle, such that (i) in the open position, the aperture is in fluid communication with the discharge end of the nozzle to permit fluid from the discharge end of the nozzle to flow through the aperture and (ii) in the closed position, at least a portion of the shutter plate inhibits fluid from the discharge end of the nozzle from flowing through the aperture.

Alternative Implementation 2. The microelectromechanical device of alternative implementation 1, wherein the shutter plate is configured such that responsive to the shutter plate being in the open position, the aperture is directly aligned with the nozzle.

Alternative Implementation 3. The microelectromechanical device of alternative implementation 1 or alternative implementation 2, wherein the shutter plate is moveable between the open position and the closed position along a transverse axis of the shutter plate.

Alternative Implementation 4. The microelectromechanical device of alternative implementation 3, wherein the shutter plate is moveable relative to the nozzle along a longitudinal axis of the shutter plate responsive to an input.

Alternative Implementation 5. The microelectromechanical device of alternative implementation 4, wherein the input is a voltage potential.

Alternative Implementation 6. The microelectromechanical device of alternative implementation 5, further comprising a power supply for providing the voltage potential.

Alternative Implementation 7. The microelectromechanical device of any one of alternative implementations 4 to 6, wherein responsive to the shutter plate being in the closed position, at least a portion of the shutter plate directly abuts at least a portion of the discharge end of the nozzle, and responsive to the shutter plate being in the open position, the shutter plate is spaced from the discharge end of the nozzle along the longitudinal axis.

Alternative Implementation 8. The microelectromechanical device of any one of alternative implementations 1 to 7, wherein the aperture of the shutter plate has a diameter that is between about 8 microns and about 12 microns.

Alternative Implementation 9. The microelectromechanical device of any one of alternative implementations 1 to 8, wherein the plurality of electrostatic actuators includes a first electrostatic actuator and a second electrostatic actuator, and the plurality of tethers includes a first pair of tethers and a second pair of tethers.

Alternative Implementation 10. The microelectromechanical device of alternative implementation 9, wherein (i) a first end of each of the first pair of tethers is coupled to a first edge of the shutter plate, and a second opposing end of each of the first pair of tethers is coupled to the first electrostatic actuator and (ii) a first end of each of the second pair of tethers is coupled to a second opposing edge of the shutter plate, and a second opposing end of each of the second pair of tethers is coupled to the second electrostatic actuator.

Alternative Implementation 11. The microelectromechanical device of any one of alternative implementations 1 to 10, wherein each of the plurality of electrostatic actuators includes a comb drive and a folded beam suspension.

Alternative Implementation 12. The microelectromechanical device of any one of alternative implementations 1 to 11, wherein each of the plurality of tethers are flexible to aid in moving the shutter plate along a transverse axis of the shutter plate.

Alternative Implementation 13. The microelectromechanical device of any one of alternative implementations 1 to 12, wherein each of the plurality of tethers are rigid to aid in inhibiting movement of the shutter plate along a longitudinal axis of the shutter plate.

Alternative Implementation 14. The microelectromechanical device of any one of alternative implementations 1 to 13, further comprising one or more rails positioned relative the shutter plate such that the one or more rails aid in inhibiting movement of the shutter plate along a longitudinal axis of the shutter plate.

Alternative Implementation 15. The microelectromechanical device of any one of alternative implementations 1 to 14, wherein the first electrostatic actuator and the second electrostatic actuator are configured to move the shutter plate relative to the discharge end of the nozzle along the transverse axis in a first direction or a second opposing direction by a predetermined distance.

Alternative Implementation 16. The microelectromechanical device of alternative implementation 15, wherein the predetermined distance between about 1 micron and about 20 microns.

Alternative Implementation 17. The microelectromechanical device of any one of alternative implementations 1 to 16, wherein the fluid includes organic molecules and a carrier gas.

Alternative Implementation 18. A microelectromechanical device includes a shutter plate, a plurality of tethers, and a plurality of electrostatic actuators. The shutter plate includes one or more apertures and is being configured to move in response to an input between a first position and a second position relative to an organic vapor jet printing (OVJP) nozzle along a longitudinal axis of the aperture. The shutter plate is positioned relative to the OVJP nozzle such that (i) in the first position along the longitudinal axis, the shutter plate is spaced from the OVJP nozzle and (ii) in the second position along the longitudinal axis, at least a portion of the shutter plate directly abuts at least a portion of the OVJP nozzle. The plurality of tethers are coupled to the shutter plate. The plurality of electrostatic actuators are coupled to one or more of the plurality of tethers. The plurality of electrostatic actuators are configured to move the shutter plate between a third position and a fourth position along a transverse axis relative to the OVJP nozzle when the shutter plate is in the first position along the longitudinal axis. The shutter plate is configured such that (i) in the third position along the transverse axis and the first position along the longitudinal axis, one of the one or more apertures is in fluid communication with the OVJP nozzle to permit organic molecules from the OVJP nozzle to flow through the aperture and (ii) in the fourth position along the transverse axis and the second position along the longitudinal axis, the direct abutment between the shutter plate and the OVJP nozzle inhibits organic molecules from the OVJP nozzle from flowing through the one or more apertures.

Alternative Implementation 19. The microelectromechanical device of alternative implementation 18, wherein the input is a voltage potential.

Alternative Implementation 20. The microelectromechanical device of alternative implementation 18 or alternative implementation 19, wherein the shutter plate includes a magnet and the input is a magnetic field.

Alternative Implementation 21. The microelectromechanical device of any one of alternative implementations 18 to 20, wherein the plurality of electrostatic actuators includes a first electrostatic actuator and a second electrostatic actuator, and the plurality of tethers includes a first pair of tethers coupled to the first electrostatic actuator and a second pair of tethers coupled to the second electrostatic actuator.

Alternative Implementation 22. The microelectromechanical device of any one of alternative implementations 18 to 21, wherein the one or more apertures includes a plurality of apertures.

Alternative Implementation 23. The microelectromechanical device of alternative implementation 22, wherein the plurality of apertures includes a first aperture having a first diameter and a second aperture having a second diameter that is different than the first diameter.

Alternative Implementation 24. A system includes an organic vapor jet printing (OVJP) print head, a nozzle, and a shutter assembly. The OVJP print head is configured to provide a fluid. The nozzle is coupled to the OVJP print head. The shutter assembly is coupled to the and includes a shutter plate having an aperture. The shutter plate is configured to move relative to the nozzle (i) between a first position and a second position along a longitudinal axis in response to a first input and (ii) with the shutter plate in the first position along the longitudinal axis, between a third position and a fourth position along a transverse axis in response to a second input. The shutter plate is positioned relative to the nozzle such that in response to the shutter plate being in the first position along the longitudinal axis and the third position along the transverse axis, the aperture is in fluid communication with the nozzle to aid in directing at least a portion of the fluid from the OVJP print head toward a substrate, and in response to the shutter plate being in the second position along the longitudinal axis and the fourth position along the transverse axis, at least a portion of the shutter plate inhibits the fluid from the OVJP print head from being directed towards the substrate.

Alternative Implementation 25. The microelectromechanical device of alternative implementation 24, wherein the first input is a voltage potential between the nozzle and the shutter plate.

Alternative Implementation 26. The microelectromechanical device of alternative implementation 24 or alternative implementation 25, wherein the second input is a mechanical input.

Alternative Implementation 27. The microelectromechanical device of alternative implementation 26, further comprising a plurality of electrostatic actuators configured to provide the mechanical input and move the shutter plate along the transverse axis.

Alternative Implementation 28. The microelectromechanical device of alternative implementation 27, further comprising a plurality of tethers, each of the plurality of tethers including a first end coupled to the shutter plate and a second opposing end coupled to one of the plurality of electrostatic actuators.

Alternative Implementation 29. The microelectromechanical device of any one of alternative implementations 24 to 28, wherein the OVJP print head includes an exhaust outlet, and moving the shutter plate from the first position to the second position to inhibit the fluid from flowing through the first aperture and the second aperture causes at least a portion of the fluid to flow through the exhaust outlet.

Alternative Implementation 30. The microelectromechanical device of any one of alternative implementations 24 to 29, wherein the fluid includes vaporized organic molecules and an inert carrier gas.

Alternative Implementation 31. A microelectromechanical device includes a nozzle and a shutter plate. The nozzle includes a discharge end for discharging vaporized organic molecules. The shutter plate includes an aperture. The shutter plate is positioned at the discharge end of the nozzle and being configured to move relative to the nozzle between an open position and a closed position in response to an input such that (i) in the open position, the aperture is in fluid communication with the discharge end of the nozzle and (ii) in the closed position, at least a portion of the shutter plate inhibits fluid communication between the discharge end of the nozzle and the aperture.

Alternative Implementation 32. The microelectromechanical device of alternative implementation 31, wherein the input is a mechanical input.

Alternative Implementation 33. The microelectromechanical device of alternative implementation 32, further comprising a plurality of tethers coupled to the shutter plate and a plurality of electrostatic actuators. each of the plurality of electrostatic actuators are coupled to one or more of the plurality of tethers, the plurality of electrostatic actuators being configured to aid in moving the shutter plate within a horizontal plane.

Alternative Implementation 34. The microelectromechanical device of alternative implementation 31, wherein the input is an electrical input.

Alternative Implementation 35. The microelectromechanical device of alternative implementation 34, further comprising a pull-down electrode pad coupled to the nozzle, the pull-down electrode pad being configured to cause the shutter plate to move within a vertical plane.

Alternative Implementation 36. The microelectromechanical device of alternative implementation 31, wherein the input is a magnetic input.

Alternative Implementation 37. The microelectromechanical device of alternative implementation 36, further comprising one or more magnets coupled to the shutter plate, the one or more magnets being configured to cause the shutter plate to move within a vertical plane responsive to the input.

Alternative Implementation 38. The microelectromechanical device of alternative implementation 37, wherein the shutter plate includes a second aperture.

Alternative Implementation 39. A system includes an organic vapor jet printing (OVJP) print head, a nozzle, a shutter plate, a plurality of tethers, a plurality of electrostatic motors, one or more memory devices, and one or more processors. The nozzle includes a first aperture for depositing organic molecules from the OVJP print head onto a substrate. The shutter plate has a second aperture. Each of the plurality of electrostatic actuators are coupled to one or more of the plurality of tethers. The one or more memory devices store machine-readable instructions. The one or more processors execute the machine-readable instructions to cause the plurality of electrostatic actuators to move the shutter plate relative to the nozzle along a transverse axis in a first direction towards a first one of the plurality of electrostatic actuators such that the organic molecules flow through the first aperture of the nozzle and the second aperture of the shutter plate towards the substrate for a first predetermined duration. Subsequent to the first predetermined duration, the plurality of electrostatic actuators move the shutter plate relative to the nozzle the along the transverse axis in a second opposing direction towards a second one of the plurality of electrostatic actuators. A first input applied to the shutter plate moves the shutter plate relative to the nozzle along a longitudinal axis such that the shutter plate inhibits the organic molecules from flowing through the first aperture of the nozzle and the second aperture of the shutter plate for a second predetermined duration.

Alternative Implementation 40. A system includes an organic vapor jet printing (OVJP) print head, a nozzle coupled to the OVJP print head, a pad, a shutter plate, a plurality of tethers coupled to the shutter plate, a plurality of electrostatic actuators, a power supply, one or more memory devices storing machine-readable instructions, and one or more processors. The nozzle is coupled to the OVJP print head and deposits organic molecules from the OVJP print head onto a substrate. The pad is coupled to the nozzle and includes a first aperture. The shutter plate includes a second aperture. Each of the plurality of tethers are coupled to the shutter plate. At least one of the one or more processors executes the machine-readable instructions to: cause the plurality of electrostatic actuators to move the shutter plate in a first direction towards a first one of the plurality of electrostatic actuators along a transverse axis such that the second aperture is in fluid communication with the first aperture, thereby permitting the fluid from the OVJP printed head to be deposited onto the substrate, cause the plurality of electrostatic actuators to move the shutter plate in a second opposing direction along the transverse axis towards a second one of the plurality of electrostatic actuators, and cause the power supply to deliver the voltage potential between the shutter plate and the pad to cause the shutter plate to move in a second opposing direction along the longitudinal axis such that at least a portion of the shutter plate directly abuts the pad, thereby inhibiting fluid communication between the first aperture and the second aperture.

One or more elements or aspects or steps, or any portion(s) thereof, from one or more of any of alternative implementations 1-40 above can be combined with one or more elements or aspects or steps, or any portion(s) thereof, from one or more of any of the other alternative implementations 1-40 or combinations thereof, to form one or more additional implementations and/or claims of the present disclosure.

While the present disclosure has been described with reference to one or more particular embodiments or implementations, those skilled in the art will recognize that many changes may be made thereto without departing from the spirit and scope of the present disclosure. Each of these embodiments or implementations and obvious variations thereof is contemplated as falling within the spirit and scope of the present disclosure. It is also contemplated that additional embodiments implementations according to aspects of the present disclosure may combine any number of features from any of the embodiments described herein.

What is claimed is:

1. A microelectromechanical device comprising:
   an organic vapor jet printing (OVJP) nozzle including a discharge end for discharging a fluid comprising organic molecules and a carrier gas;
   a shutter plate including an aperture, the shutter plate positioned at the discharge end of the OVJP nozzle;
   a plurality of tethers coupled to the shutter plate; and
   a plurality of electrostatic actuators coupled to one or more of the plurality of tethers, at least one of the plurality of tethers comprising an elongated structure extending from a first end at the shutter plate to an opposing second end at one of the plurality of electrostatic actuators, the plurality of electrostatic actuators being configured to move the shutter plate between an open position and a closed position relative the discharge end of the OVJP nozzle, such that (i) in the open position, the aperture is in fluid communication with the discharge end of the OVJP nozzle to permit the fluid from the discharge end of the OVJP nozzle to flow through the aperture and (ii) in the closed position, at least a portion of the shutter plate inhibits the fluid from the discharge end of the OVJP nozzle from flowing through the aperture,
   wherein the plurality of tethers are flexible to aid in moving the shutter plate along a transverse axis of the shutter plate and to allow movement of the shutter plate along a longitudinal axis generally perpendicular to the transverse axis.

2. The microelectromechanical device of claim 1, wherein the shutter plate is configured such that responsive to the shutter plate being in the open position, the aperture is directly aligned with the OVJP nozzle.

3. The microelectromechanical device of claim 1, wherein the shutter plate is moveable between the open position and the closed position along a transverse axis of the shutter plate.

4. The microelectromechanical device of claim 3, wherein the shutter plate is moveable relative to the OVJP nozzle along the longitudinal axis of the shutter plate responsive to an input.

5. The microelectromechanical device of claim 4, wherein the input is a voltage potential.

6. The microelectromechanical device of claim 4, wherein responsive to the shutter plate being in the closed position, at least a portion of the shutter plate directly abuts at least a portion of the discharge end of the OVJP nozzle, and responsive to the shutter plate being in the open position, the shutter plate is spaced from the discharge end of the OVJP nozzle along the longitudinal axis.

7. The microelectromechanical device claim 1, wherein the aperture of the shutter plate has a diameter that is between about 8 microns and about 12 microns.

8. The microelectromechanical device of claim 1, wherein the plurality of electrostatic actuators includes a first electrostatic actuator and a second electrostatic actuator, and the plurality of tethers includes a first pair of tethers and a second pair of tethers.

9. The microelectromechanical device of claim 8, wherein (i) a first end of each of the first pair of tethers is coupled to a first edge of the shutter plate, and a second opposing end of each of the first pair of tethers is coupled to the first electrostatic actuator and (ii) a first end of each of the second pair of tethers is coupled to a second opposing edge of the shutter plate, and a second opposing end of each of the second pair of tethers is coupled to the second electrostatic actuator.

10. The microelectromechanical device of claim 1, wherein each of the plurality of electrostatic actuators includes a comb drive and a folded beam suspension.

11. The microelectromechanical device of claim 1, wherein the first electrostatic actuator and the second electrostatic actuator are configured to move the shutter plate relative to the discharge end of the OVJP nozzle along the transverse axis in a first direction or a second opposing direction by a predetermined distance that is between about 1 micron and about 20 microns.

12. A microelectromechanical device comprising:
    a shutter plate including one or more apertures, the shutter plate being configured to move in response to an input between a first position and a second position relative to an organic vapor jet printing (OVJP) nozzle along a longitudinal axis of the aperture, the shutter plate being positioned relative to the OVJP nozzle such that (i) in the first position along the longitudinal axis, the shutter plate is spaced from the OVJP nozzle and (ii) in the second position along the longitudinal axis, at least a portion of the shutter plate directly abuts at least a portion of the OVJP nozzle;
    a plurality of tethers coupled to the shutter plate; and
    a plurality of electrostatic actuators, each of the plurality of electrostatic actuators being coupled to one or more of the plurality of tethers, the plurality of electrostatic actuators being configured to move the shutter plate between a third position and a fourth position along a transverse axis relative to the OVJP nozzle when the shutter plate is in the first position along the longitudinal axis,
    the shutter plate being configured such that (i) in the third position along the transverse axis and the first position along the longitudinal axis, one of the one or more apertures is in fluid communication with the OVJP nozzle to permit organic molecules from the OVJP nozzle to flow through the aperture and (ii) in the fourth position along the transverse axis and the second position along the longitudinal axis, the direct abutment between the shutter plate and the OVJP nozzle inhibits organic molecules from the OVJP nozzle from flowing through the one or more apertures.

13. The microelectromechanical device of claim 12, wherein the shutter plate includes a magnet and the input is a magnetic field.

14. The microelectromechanical device of claim 12, wherein the one or more apertures includes a plurality of apertures.

15. The microelectromechanical device of claim 14, wherein the plurality of apertures includes a first aperture having a first diameter and a second aperture having a second diameter that is different than the first diameter.

16. A system comprising:
an organic vapor jet printing (OVJP) print head configured to provide a fluid;
a nozzle coupled to the OVJP print head; and
a shutter assembly coupled to the nozzle, the shutter assembly including:
a shutter plate having an aperture, the shutter plate being configured to move relative to the nozzle (i) between a first position and a second position along a longitudinal axis in response to a first input and (ii) with the shutter plate in the first position along the longitudinal axis, between a third position and a fourth position along a transverse axis in response to a second input,
the shutter plate being positioned relative to the nozzle such that:
in response to the shutter plate being in the first position along the longitudinal axis and the third position along the transverse axis, the aperture is in fluid communication with the nozzle to aid in directing at least a portion of the fluid from the OVJP print head toward a substrate, and
in response to the shutter plate being in the second position along the longitudinal axis and the fourth position along the transverse axis, at least a portion of the shutter plate inhibits the fluid from the OVJP print head from being directed towards the substrate.

17. The system of claim 16, wherein the first input is a voltage potential between the nozzle and the shutter plate.

18. The system of claim 16, wherein the second input is a mechanical input.

19. The system of claim 18, further comprising:
a plurality of electrostatic actuators configured to provide the mechanical input and move the shutter plate along the transverse axis; and
a plurality of tethers, each of the plurality of tethers including a first end coupled to the shutter plate and a second opposing end coupled to one of the plurality of electrostatic actuators.

20. The system of claim 16, wherein the OVJP print head includes an exhaust outlet, and moving the shutter plate from the first position to the second position to inhibit the fluid from flowing through the first aperture and the second aperture causes at least a portion of the fluid to flow through the exhaust outlet.

21. A microelectromechanical device comprising:
a nozzle including a discharge end for discharging vaporized organic molecules; and
a shutter plate including an aperture, the shutter plate positioned at the discharge end of the nozzle and being configured to move relative to the nozzle between an open position and a closed position in response to inputs such that (i) in the open position, the aperture is in fluid communication with the discharge end of the nozzle and (ii) in the closed position, at least a portion of the shutter plate inhibits fluid communication between the discharge end of the nozzle and the aperture, wherein the shutter plate is configured to move within a horizontal and vertical plane.

22. The microelectromechanical device of claim 21, further comprising:
a plurality of tethers coupled to the shutter plate; and
a plurality of electrostatic actuators, each of the plurality of electrostatic actuators being coupled to one or more of the plurality of tethers, the plurality of electrostatic actuators being configured to aid in moving the shutter plate within the horizontal plane.

23. The microelectromechanical device of claim 21, wherein an input is an electrical input.

24. The microelectromechanical device of claim 23, further comprising a pull-down electrode pad coupled to the nozzle, the pull-down electrode pad being configured to cause the shutter plate to move within the vertical plane.

25. The microelectromechanical device of claim 21, wherein an input is a magnetic field.

26. The microelectromechanical device of claim 25, further comprising one or more magnets coupled to the shutter plate, the one or more magnets being configured to cause the shutter plate to move within the vertical plane responsive to the input.

27. The microelectromechanical device of claim 6, wherein the shutter plate includes a second aperture.

\* \* \* \* \*